(12) United States Patent
Kohyama

(10) Patent No.: US 6,329,683 B2
(45) Date of Patent: Dec. 11, 2001

(54) SEMICONDUCTOR MEMORY DEVICE AND MANUFACTURING METHOD THEREOF WHICH MAKE IT POSSIBLE TO IMPROVE RELIABILITY OF CELL-CAPACITOR AND ALSO TO SIMPLIFY THE MANUFACTURING PROCESSES

(75) Inventor: Yusuke Kohyama, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/748,132

(22) Filed: Dec. 27, 2000

(30) Foreign Application Priority Data

Dec. 28, 1999 (JP) .................................. 11-375479

(51) Int. Cl.[7] .............................................. H01L 21/8242
(52) U.S. Cl. ........................... 257/306; 438/253; 438/254
(58) Field of Search ........................... 257/300, 306–311; 438/3, 238–240, 253–256, 381, 396–399

(56) References Cited

U.S. PATENT DOCUMENTS 5,885,864 * 3/1999 Ma ...................................... 438/253

FOREIGN PATENT DOCUMENTS 10-289984   10/1998   (JP) .
11-26718    1/1999    (JP) .

OTHER PUBLICATIONS

Wakamiya, W., et al., "Novel Stacked Capacitor Cell for 64Mb Dram", Symposium on VLSI Technology, pp. 69–70, 1989.

* cited by examiner

Primary Examiner—Jey Tsai
(74) Attorney, Agent, or Firm—Banner & Witcoff, Ltd.

(57) ABSTRACT

In this DRAM, an $SiO_2$ film for assuring the step coverage of cell-capacitor of cylinder type is left remained only in the peripheral circuit region. The capacitor upper electrode is formed extending from the memory cell array region to the peripheral circuit region. Since the capacitor upper electrode in the peripheral circuit region is disposed higher than the upper surface of the capacitor upper electrode which constitutes the cell-capacitor, this capacitor upper electrode in the peripheral circuit region is employed as a stopper for subsequently flattening the interlayer insulating film. Subsequently, the interlayer insulating film is employed as a mask for etching the capacitor upper electrode in the peripheral circuit region.

16 Claims, 15 Drawing Sheets

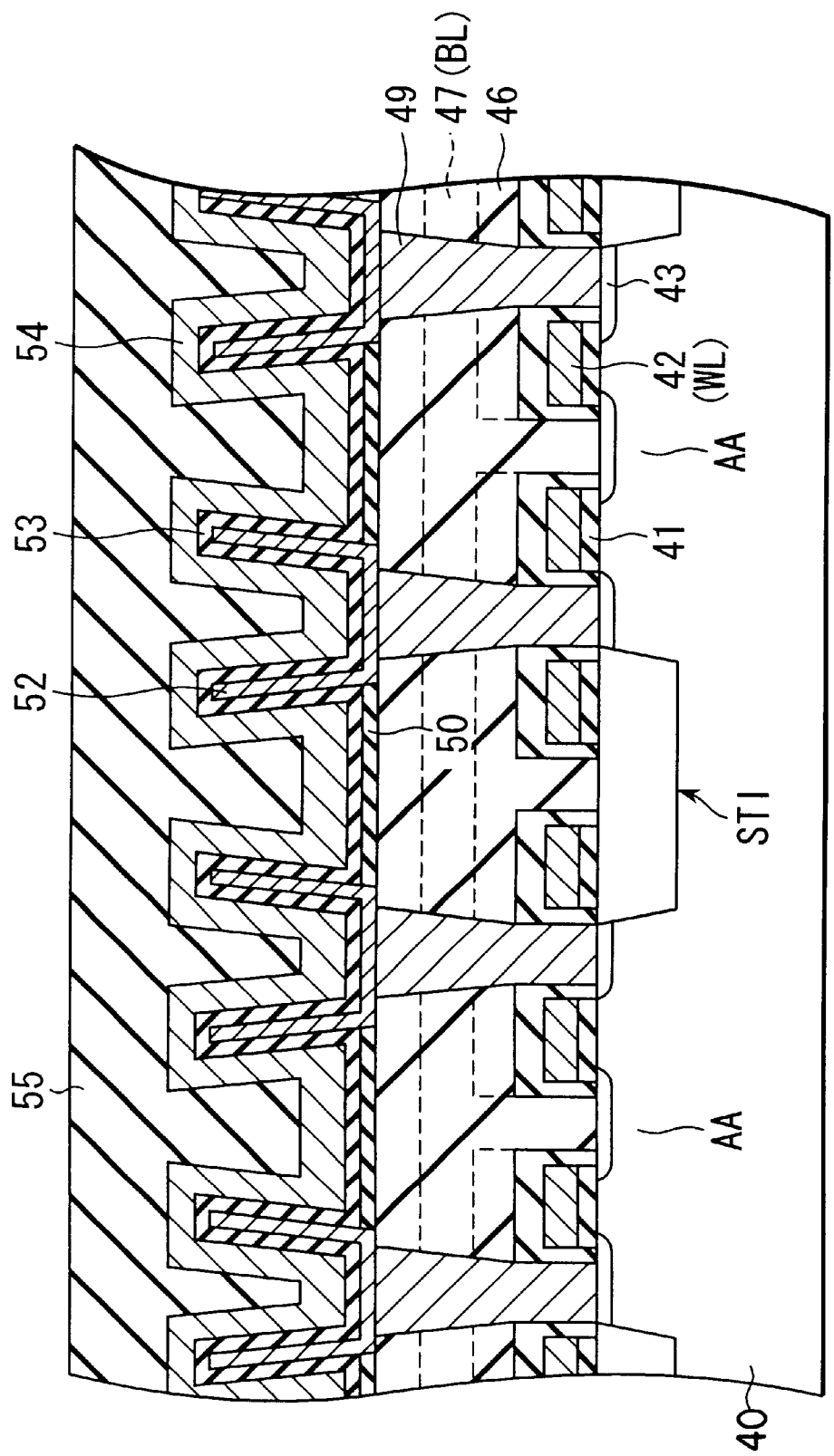
FIG. 2C  MEMORY CELL ARRAY REGION

MEMORY CELL ARRAY REGION

MEMORY CELL ARRAY REGION

SEMICONDUCTOR MEMORY DEVICE AND MANUFACTURING METHOD THEREOF WHICH MAKE IT POSSIBLE TO IMPROVE RELIABILITY OF CELL-CAPACITOR AND ALSO TO SIMPLIFY THE MANUFACTURING PROCESSES

CROSS-REFERENCE TO RELATED APPLICATIONS

This application is based upon and claims the benefit of priority from the prior Japanese Patent Application No. 11-375479, filed Dec. 28, 1999, the entire contents of which are incorporated herein by reference.

BACKGROUND OF THE INVENTION

This invention relates to a semiconductor memory device and to the manufacturing method of the semiconductor memory device. In particular, this invention relates to a peripheral structure of the cell-capacitor of DRAM and to the method of fabricating the peripheral structure of the cell-capacitor.

Generally speaking, semiconductor memory devices are still demanded to be further improved in various aspects such as the progress of refinement, the reducing the power supply voltage, the higher operating speed, higher reliability, etc. In particular, the refinement technique for DRAM (Dynamic Random Access Memory) is now increasingly promoted so that the area to be occupied by the memory cell unit is increasingly miniaturized. Therefore, the issue to be solved urgently at present is how to secure a sufficient capacity of cell-capacitor within a limited area of cell.

The capacity of cell-capacitor can be enlarged by increasing the surface area of the cell-capacitor. Under the circumstances, a lot of proposals have been set forth so far for realizing both of the enlargement of surface area of cell-capacitor and the refinement of cell-capacitor.

One example of the conventional structure wherein the surface area of cell-capacitor can be increased may be represented by a cylinder structure which is set forth in a publication: W. Wakamiya et al., "Novel Stacked Capacitor Cell for 64 Mb DRAM", Symposium on VLSI Technology Digest, pp. 69–70, 1989. This structure is one kind of stacked capacitor wherein a cylindrical capacitor is three-dimensionally disposed so as to increase the surface area, while suppressing the area occupied by the capacitor. However, this cylinder structure is defective in that it is difficult to perform the global flattening of interlayer insulating film covering the cell-capacitor. In view of overcoming this problem, Japanese Patent Laid Open No. 11-26718 sets forth a process which is capable of simplifying this flattening step even in the stacked capacitor of cylinder structure. However, if it is tried to secure the flatness of an interlayer insulating film covering the stacked capacitor, the number of manufacturing steps is inevitably increased, resulting in an increase in manufacturing cost. Meantime, a problem involved in the manufacture of DRAM is an especially severe competition among manufacturers in terms of manufacturing cost, so that various ideas have been adopted by each manufacturer at present for the purpose of simplifying as much as possible the fabricating process of DRAM. Therefore, as far as DRAM is concerned, it may not be appropriate in view of the present situations as mentioned above to adopt a manufacturing method which necessitates an increase in number of manufacturing steps.

Additionally, the manufacturing method set forth in Japanese Patent Laid Open No. 11-26718 is defective in that the properties of the cell-capacitor of DRAM may be deteriorated. The reasons for this will be explained below with reference to FIG. 1. FIG. 1 is a cross-sectional view illustrating the memory cell array region, the marginal portion of memory cell array region and peripheral circuit region of a conventional DRAM. By the way, this memory cell array region represents a region where a memory cell consisting of a cell transistor and a cell-capacitor are to be formed. This peripheral circuit region represents a region where various kinds of peripheral circuits (excluding the memory cell) such as a sense amplifier and a decoder are to be formed. This marginal portion of memory cell array region represents a region which constitutes a boundary between the memory cell array region and the peripheral circuit region.

As shown in FIG. 1, a silicon substrate 10 is provided with element regions AA (Active Area) and element isolation regions STI (Shallow Trench Isolation) surrounding the element regions AA. A cell transistor (not shown) is formed in each of the element regions AA within the memory cell array region, and a peripheral transistor is formed in each of the element regions AA within the peripheral circuit region. The peripheral transistor is constituted by a gate insulating film 11 formed on the silicon substrate 10, a gate electrode 12 formed on the gate insulating film 11, and impurity diffusion layers 13 formed inside the substrate 10 and functioning as a source region or a drain region. The gate electrode 12 is covered by an SiN film 14 for instance. The structure of the cell transistor is fundamentally the same as that of this peripheral transistor, wherein the gate electrode of the cell transistor functions as a word line 15.

Further, an interlayer insulating film 16 is deposited on the silicon substrate 10 so as to cover the cell transistor and the peripheral transistor. The interlayer insulating film 16 is provided therein with bit lines 17 located within the memory cell array region and connected with the drain region of the cell transistor. A metallic wiring layer 18 which is connected with the impurity diffusion layer 13 of the peripheral transistor is formed within the peripheral circuit region and at the same level as that the bit lines 17. Additionally, contact plugs 19 connected with the source region of the cell transistor are formed within the memory cell array region. This contact plugs 19 are formed for the purpose of connecting the cell transistor with the cell-capacitor.

Next, the structure disposed above the interlayer insulating film 16 covering these transistors, the bit lines 17 and the metallic wiring layer 18 will be explained.

An SiN film 20 is deposited on the interlayer insulating film 16 except the portions where the top surface of the contact plugs 19 is exposed. Further, as far as the marginal portion of memory cell array region and the peripheral circuit region are concerned, an $SiO_2$ film 21 is deposited on the SiN film 20. On the other hand, as far as the memory cell array region is concerned, a storage node electrode 22 of cylinder type is disposed enabling it to be contacted with the contact plug 19 at the bottom portion thereof. Further, as far as the region where the memory cell array region is contacted with the marginal portion of memory cell array region is concerned, the storage node electrode 22 is formed along the sidewall of the $SiO_2$ film 21. This storage node electrode 22 is formed also on a portion of the $SiO_2$ film 21 which is located within the marginal portion of memory cell array region. Furthermore, as far as the memory cell array region and the marginal portion of memory cell array region are concerned, a capacitor insulating film 23 and a plate electrode 24 are deposited over these regions to thereby constitute a cell-capacitor.

Additionally, an interlayer insulating film 25 is deposited over the memory cell array region, the marginal portion of memory cell array region and the peripheral circuit region. As far as the marginal portion of memory cell array region is concerned, a contact plug 26 connected with the plate electrode 24 is formed in the interlayer insulating film 25, and as far as the peripheral circuit region is concerned, a contact plug 27 is formed connecting with the metallic wiring layer 18 being at the same level as that of the bit line. Further, metallic wiring layers 28 and 29 are formed so as to be connected with these contact plugs 26 and 27, respectively, thereby accomplishing the DRAM.

According to this structure of the DRAM, while a cell-capacitor of cylinder type is formed on the interlayer insulating film 16 as far as the memory cell array region is concerned, the $SiO_2$ film 21 is formed up to almost the same level as the top surface of the storage node electrode 22 of the cell-capacitor in both of the marginal portion of memory cell array region and the peripheral circuit region. As a result, it becomes possible to assure the flatness of the interlayer insulating film 25 covering the storage node electrode 22 and the $SiO_2$ film 21.

The contact plug 26 which is indispensable for the purpose of giving an electric potential to the plate electrode is generally disposed at the marginal portion of memory cell array region. Further, for the purpose of simplifying the fabricating process, a contact hole 30 for forming the contact plug 26 is generally formed concurrently with a contact hole 31 for forming the contact plug 27 of the peripheral circuit region by the RIE (Reactive Ion Etching) method for instance.

However, while the bottom of the contact hole 30 of the memory cell array region is disposed at the same level with the top surface of the plate electrode 24 which is disposed over the $SiO_2$ film 21, the bottom of the contact hole 31 of the peripheral circuit region is disposed at the same level with the top surface of the bit line 17. Therefore, if these two contact holes 30 and 31 are concurrently formed, despite that the formation of the contact hole 30 has been accomplished beforehand, the bottom of contact hole 30 is still subjected to a plasma damage due to RIE until the formation of the contact hole 31 is accomplished. As a result, the properties of the cell-capacitor may be deteriorated.

Moreover, the storage node electrode 22, capacitor insulating film 23 and plate electrode 24 of the cell-capacitor that will be disposed at a memory cell array region contacting with the marginal portion of memory cell array region must be formed along the sidewall and top surface of the $SiO_2$ film 21. If the electrode 22, film 23, and electrode 24 are so formed, the resultant cell-capacitor differs in structure from that of the cell-capacitors located at other regions. The capacitor inevitably become a dummy capacitor. This deteriorates the areal efficiency of the DRAM.

BRIEF SUMMARY OF THE INVENTION

Therefore, an object of this invention is to provide a semiconductor memory device and a manufacturing method thereof which make it possible to improve the reliability of the cell-capacitor and also to simplify the manufacturing processes.

This object of the invention has been achieved by a semiconductor memory device which comprises;

a semiconductor body provided with a memory cell array region wherein a cell transistor of memory cell is formed, with a peripheral circuit region wherein peripheral circuits other than the memory cell are formed, and with a marginal portion of memory cell array region which constitutes a boundary between the memory cell array region and the peripheral circuit region;

an insulating film formed on the semiconductor body and having an opening in the memory cell array region and the marginal portion of memory cell array region;

a cell-capacitor lower electrode of cylinder type which is formed on the semiconductor body in the memory cell array region and is electrically connected with an impurity diffusion layer of the cell transistor;

a cell-capacitor insulating film covering the cell-capacitor lower electrode;

a cell-capacitor upper electrode on the cell-capacitor insulating film and the semiconductor body within the memory cell array region and the marginal portion of memory cell array region;

an interlayer insulating film formed on the cell-capacitor upper electrode and the insulating film; and a first contact plug formed in the interlayer insulating film and connected with the cell-capacitor upper electrode within the marginal portion of memory cell array region;

wherein the cell-capacitor upper electrode formed extending from the memory cell array region to the marginal portion of memory cell array region stands also along a sidewall of the opening formed in the insulating film.

The aforementioned object of the invention has been also achieved by a method of fabricating a semiconductor memory device which comprises the steps of;

forming a cell transistor of memory cell and a peripheral transistor on semiconductor substrate within a memory cell array region and a peripheral circuit region, respectively;

forming an interlayer insulating film on the semiconductor substrate within the memory cell array region, the peripheral circuit region and the marginal portion of memory cell array region which constitutes a boundary between the memory cell array region and the peripheral circuit region to thereby cover the cell transistor and the peripheral transistor;

forming a contact plug connected with the cell transistor in the interlayer insulating film;

forming an insulating film on the interlayer insulating film;

forming a groove in the insulating film within the memory cell array region, the groove being formed to a depth reaching down to an upper surface of the interlayer insulating film to thereby permit the top surface of the contact plug to be exposed at a bottom of the groove;

forming a cell-capacitor lower electrode on the bottom face and sidewall of the groove as well as on the insulating film within a region extending from the memory cell array region to the peripheral circuit region to thereby permit the cell-capacitor lower electrode to be contacted with the contact plug at the bottom of the groove;

forming an etching mask on the cell-capacitor lower electrode within the peripheral circuit region and in the groove; and forming a cell-capacitor lower electrode of cylinder type by etching part of the insulating film existing in the memory cell array region and the marginal portion of memory cell array region.

Additionally, the aforementioned object of the invention has been also achieved by a method of fabricating a semiconductor memory device which comprises the steps of;

forming an insulating film on a semiconductor body provided with a memory cell array region wherein a cell transistor of memory cell is formed, with a peripheral circuit region wherein peripheral circuits other than the memory cell are formed, and with a marginal portion of memory cell array region which constitutes a boundary between the memory cell array region and the peripheral circuit region;

removing parts of the insulating film which are at the memory cell array region and at the marginal portion of the memory cell array region, thereby making opening;

forming a plurality of cell-capacitor lower electrodes of cylinder type in the opening;

forming a cell-capacitor insulating film covering at least the cell-capacitor lower electrodes;

forming cell-capacitor upper electrode on the cell-capacitor insulating film and over a region extending from the memory cell array region to the peripheral circuit region;

forming an interlayer insulating film on the cell-capacitor upper electrodes; and flattening the interlayer insulating film by making use of, as a stopper, the cell-capacitor upper electrode which are located in the peripheral circuit region.

Furthermore, the aforementioned object of the invention has been also achieved by a method of fabricating a semiconductor memory device which comprises the steps of;

forming an insulating film on a semiconductor body provided with a memory cell array region wherein a cell transistor of memory cell is formed, with a peripheral circuit region wherein peripheral circuits other than the memory cell are formed, and with a marginal portion of memory cell array region which constitutes a boundary between the memory cell array region and the peripheral circuit region;

removing parts of the insulating film which are at the memory cell array region and at the marginal portion of the memory cell array region, thereby making opening;

forming a plurality of cell-capacitor lower electrodes of cylinder type in the opening;

forming a cell-capacitor insulating film covering at least the cell-capacitor lower electrodes;

forming cell-capacitor upper electrode on cell-capacitor insulating film and over a region extending from the memory cell array region to the peripheral circuit region;

forming a first interlayer insulating film on the cell-capacitor upper electrodes;

flattening the first interlayer insulating film by making use of, as a stopper, the cell-capacitor upper electrode which are located in the peripheral circuit region to thereby permit the cell-capacitor upper electrodes existing in the peripheral circuit region to be exposed; and etching away at least the cell-capacitor upper electrodes existing in the peripheral circuit region by making use of, as a mask, the first interlayer insulating film located in the memory cell array region and in the marginal portion of memory cell array region.

According to the semiconductor memory device and the manufacturing methods thereof, it is possible to avoid the production of dummy capacitor in the memory cell array region and therefore to improve the areal efficiency of the DRAM.

Furthermore, it is possible according to this invention to minimize the plasma damage that may be inflicted upon the plate electrode of cell-capacitor at the manufacturing steps using the RIE method. Therefore, it is possible to prevent the cell-capacitor from being deteriorated and hence to improve the performance and reliability of DRAM. Additionally, the number of manufacturing steps of DRAM can be reduced without sacrificing the step-covering property of the cell-capacitor of cylinder type. Therefore, it is possible to reduce the manufacturing cost while permitting the yield to be improved in the manufacture of DRAM.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2B and 2C respectively shows a cross-sectional view of a DRAM according to the first embodiment of this invention;

DETAILED DESCRIPTION OF THE INVENTION

Figure 1:
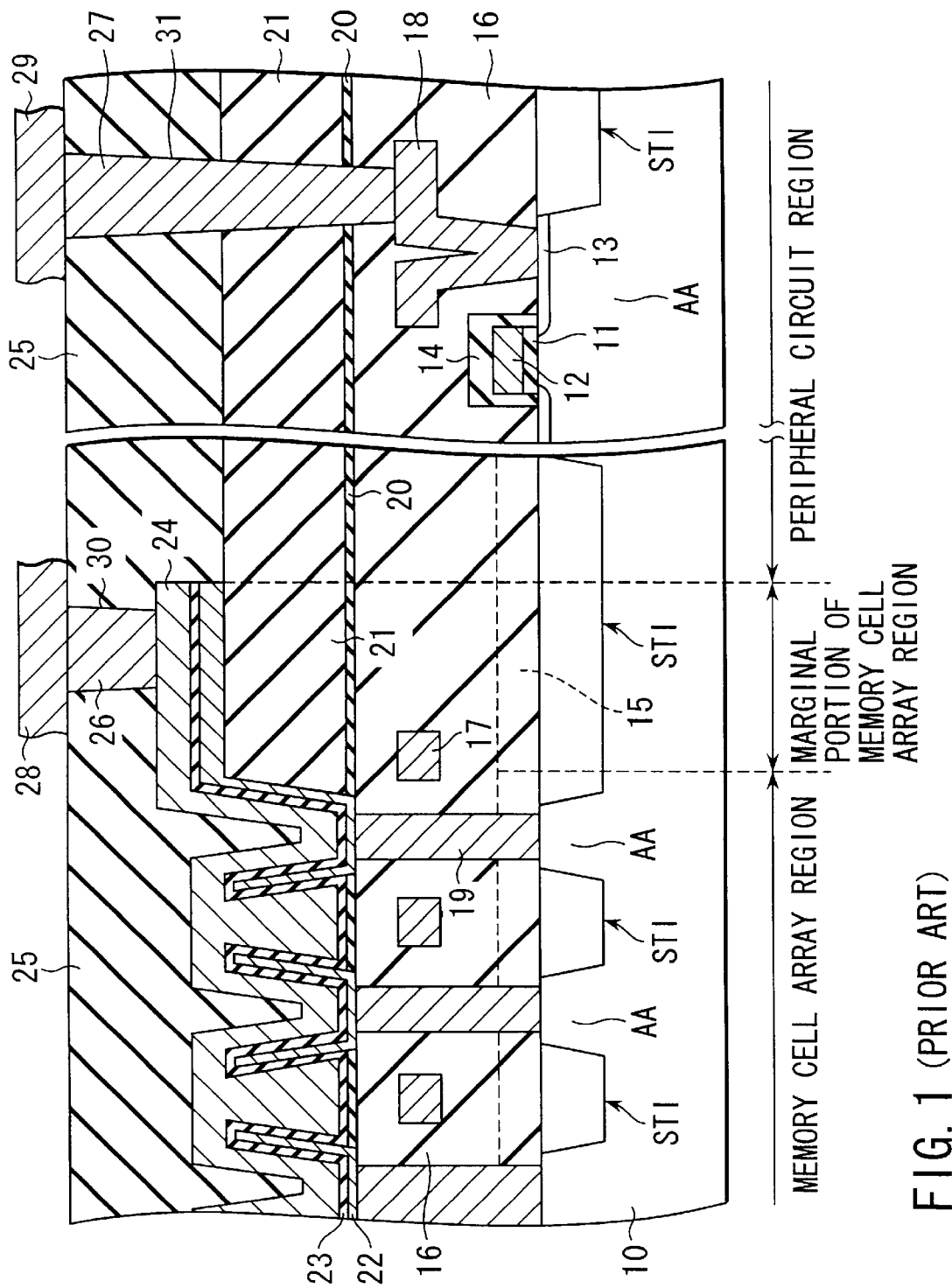
FIG. 1 is a cross-sectional view illustrating a conventional DRAM.
Figure 2A:
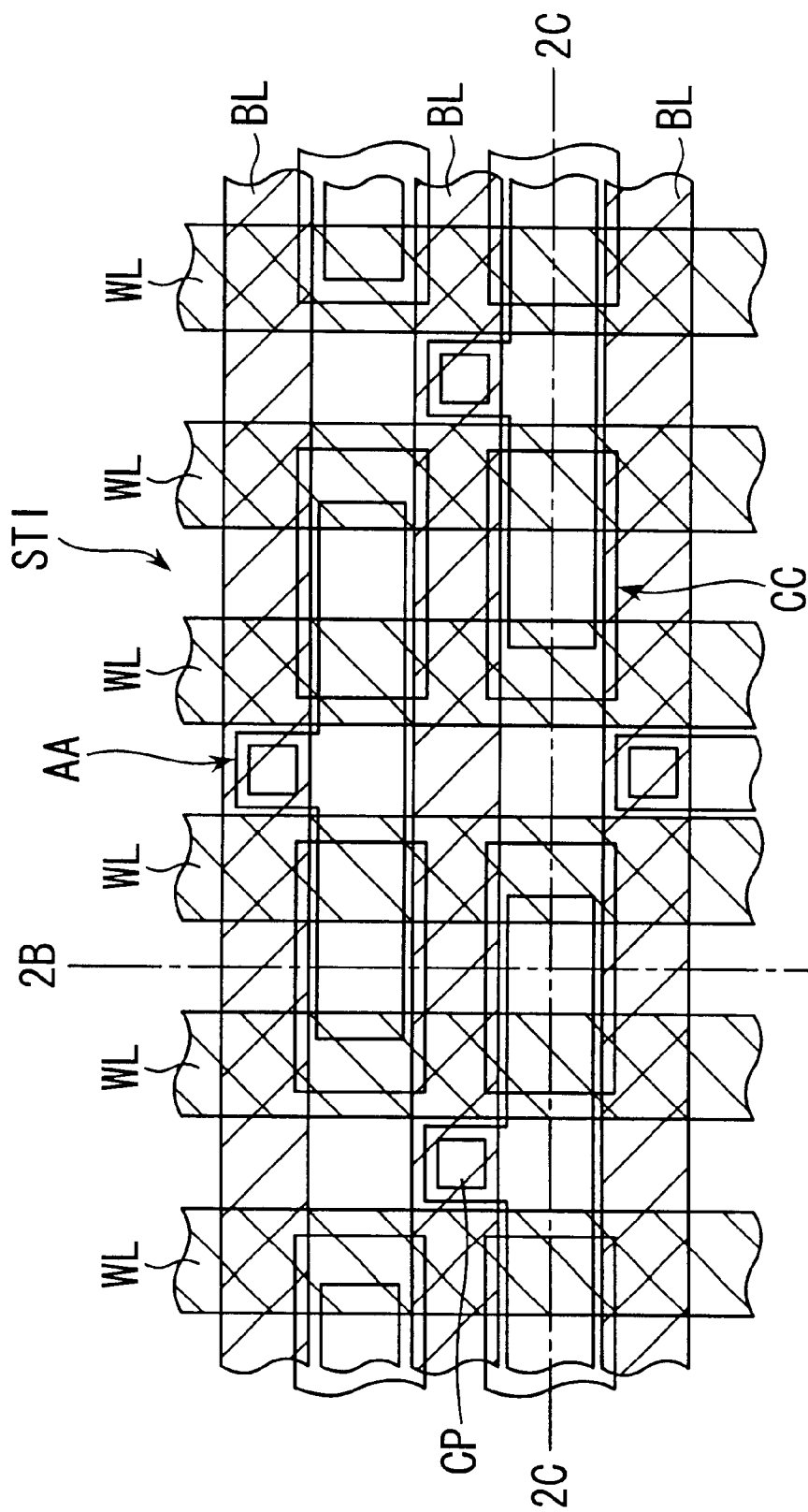
FIG. 2A is a plan view of the DRAM according to a first embodiment of this invention.
Figure 2B:
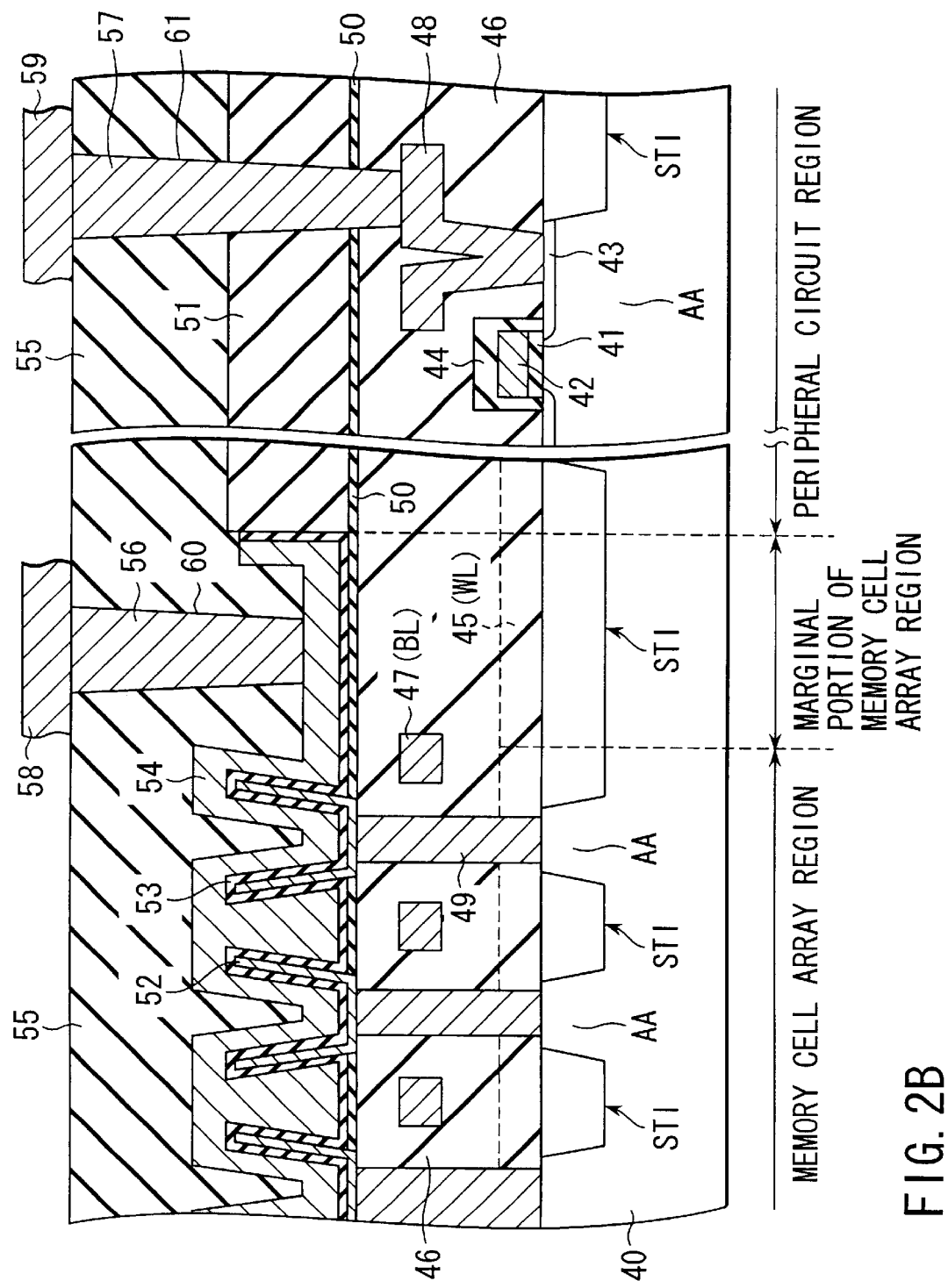

FIGS. 2A to 2C illustrate the semiconductor memory device according to a first embodiment of this invention and the method of fabricating the semiconductor memory device. Specifically, FIG. 2A is a plan view of the memory cell array region of DRAM. FIG. 2B is a cross-sectional view taken along the line 2B—2B of FIG. 2A, illustrating the memory cell array region, marginal portion of memory cell array region, and peripheral circuit region of DRAM. FIG. 2C is a cross-sectional view taken along the line 2C—2C of FIG. 2A, illustrating the memory cell array region of DRAM. By the way, as described above, the memory cell array region represents a region where a memory cell consisting of a cell transistor and a cell-capacitor are to be formed. The peripheral circuit region represents a region where various kinds of peripheral circuits (excluding the memory cell) such as a sense amplifier and a decoder are to be formed. The marginal portion of memory cell array region represents a region which constitutes a boundary between the memory cell array region and the peripheral circuit region. Further, the DRAM to be explained in this embodiment is constructed such that the cell-capacitor thereof is formed of a stacked type cylinder structure, and the cell structure thereof is formed of a COB (Capacitor Over Bit line) structure wherein the cell-capacitor is formed above the bit line.

As shown in the plan view of FIG. 2A, as far as the memory cell array region is concerned, the element regions AA are disposed in a staggered pattern in a silicon substrate, and the regions other than where element regions AA are formed are constituted by an element isolation region STI. Inside each element region AA, there are formed a couple of memory cells. The gate electrode (word line : WL) of the cell transistor constituting the each memory cell is extended bridging a plurality of element regions AA. The drain regions of cell transistor disposed neighboring to each other in each element region AA are connected via a contact plug (CP) with a bit line BL formed in a direction orthogonally intersecting with the word line WL. At the edge portion of the element region AA, there is formed a cell-capacitor (CC) of each cell transistor, the cell-capacitor CC being disposed at a higher level than the bit line BL.

Next, the sectional construction of DRAM according to this embodiment will be explained with reference to FIGS. 2B and 2C.

As shown in FIGS. 2B and 2C, the element regions AA as well as the element isolation regions STI surrounding the element regions AA are formed on the silicon substrate 40. The cell transistor and the peripheral transistor are formed within each of the element regions AA formed in the memory cell array region and in the peripheral circuit region. The cell transistor and the peripheral transistor are respectively constituted by a gate insulating film 41 formed on the silicon substrate 40, a gate electrode 42 formed on the gate insulating film 41, and an impurity diffusion layer 43 functioning as source/drain regions and formed in the silicon substrate 40. The gate electrode 42 is covered with an SiN film 44. The gate electrode of the cell transistor is designed to be functioned as a word line WL 45.

Further, an interlayer insulating film 46 is formed over the memory cell array region, the marginal portion of memory cell array region and the peripheral circuit region to thereby cover the cell transistor and the peripheral transistor. A bit line BL 47 connected with the drain region 43 of the cell transistor is formed in this interlayer insulating film 46 located within the memory cell array region, while a metallic wiring layer 48 connected with the impurity diffusion layer 43 of the peripheral transistor is formed in the peripheral circuit region and at the same level with the bit line 47. Furthermore, a contact plug 49 is formed within the memory cell array region so as to be connected with the source region 43 of the cell transistor. This contact plug 49 is formed for the purpose of connecting the cell transistor with the cell-capacitor.

Next, the structure disposed above the interlayer insulating film 46 covering these transistors, the bit lines 47 and the metallic wiring layer 48 will be explained.

An SiN film 50 is deposited on the interlayer insulating film 46 except the portions where the top surface of the contact plugs 49 is exposed. Further, as far as the peripheral circuit region is concerned, an $SiO_2$ film 51 is deposited on the SiN film 50. On the other hand, as far as the memory cell array region is concerned, a storage node electrode 52 of cylinder type is disposed enabling it to be contacted with the contact plug 49 at the bottom portion thereof. Additionally, a capacitor insulating film 53 and a plate electrode 54 are formed on a region extending from the memory cell array region to the marginal portion of memory cell array region. By the way, as far as the region where the marginal portion of memory cell array region is contacted with the peripheral circuit region is concerned, these capacitor insulating film 53 and plate electrode 54 are formed also on the sidewall of the $SiO_2$ film 51.

Additionally, an interlayer insulating film 55 is deposited over the memory cell array region, the marginal portion of memory cell array region and the peripheral circuit region. As far as the marginal portion of memory cell array region is concerned, a contact plug 56 connected with the plate electrode 54 is formed in the interlayer insulating film 55, and as far as the peripheral circuit region is concerned, a contact plug 57 which is connected with the metallic wiring layer 48 is formed at the same level as that of the bit line 47. Further, metallic wiring layers 58 and 59 are formed so as to be connected with these contact plugs 56 and 57, respectively, thereby accomplishing the DRAM.

According to this structure of the DRAM, by contrast to the structure of the conventional DRAM, the $SiO_2$ film 51 is not formed in the marginal portion of memory cell array region. As a result, it becomes possible to fabricate all of the cell-capacitors existing within the memory cell array region so as to have the same structure with each other. In other words, since it is no longer necessary to form a dummy cell-capacitor, the areal efficiency of DRAM can be improved.

Next, the method of fabricating the DRAM having the aforementioned structure will be explained with reference to FIGS. 3A to 3L, which sequentially illustrate, as a cross-sectional view, the manufacturing process of the DRAM. Specifically, FIGS. 3A to 3K illustrate the memory cell array region and the marginal portion of memory cell array region, while FIG. 3L illustrates the memory cell array region, the marginal portion of memory cell array region and the peripheral circuit region. For convenience' sake, the interlayer insulating film 46 as well as the construction disposed below the interlayer insulating film 46 are omitted in FIGS. 3A to 3K.

Figure 3A:
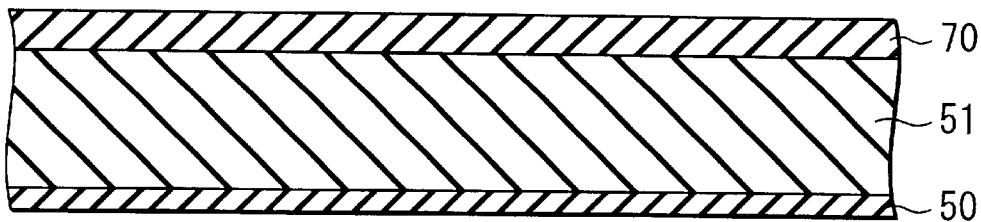
FIGS. 3A to 3L respectively shows a cross-sectional view sequentially illustrating the manufacturing process of the DRAM according to the first embodiment of this invention.

First of all, as shown in FIG. 3A, the SiN film 50, the $SiO_2$ film 51 and also an amorphous silicon film 70 are successively deposited on the interlayer insulating film 46 located in the memory cell array region, the marginal portion of memory cell array region and the peripheral circuit region by a CVD (Chemical Vapor Deposition) method for instance. This amorphous silicon film 70 is a film which is generally called a pattern transferring film and can be selected from those exhibiting a high etching selectivity to the SiN film 50 and the $SiO_2$ film 51. For example, Ru (ruthenium), TiN or C (carbon) may be employed for this amorphous silicon film 70.

Figure 3B:
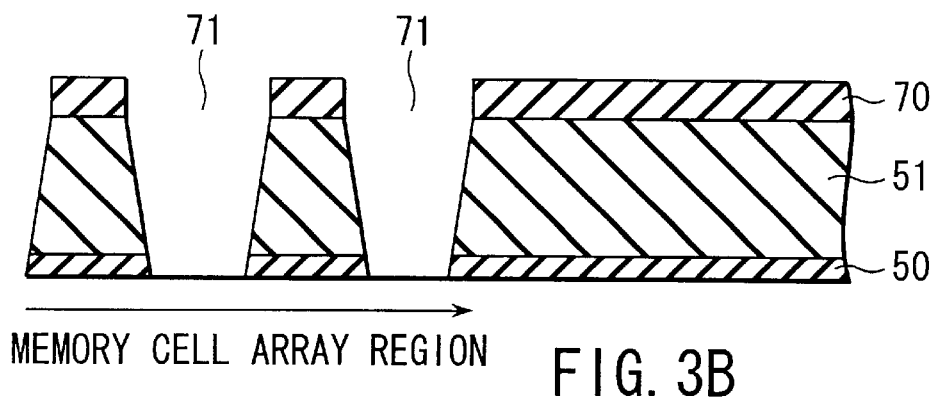

Then, as shown in FIG. 3B, by making use of lithographic technique and an anisotropic etching method such as RIE method, the amorphous silicon film 70, the $SiO_2$ film 51 and the SiN film 50 all located within the memory cell array region are partially removed to form a groove 71. This groove 71 is employed for forming the storage node electrode of the cell-capacitor of cylinder type and is formed to have a cylindrical configuration. By the way, the amorphous silicon film 70 may be removed after the formation of the groove 71.

Figure 3C:
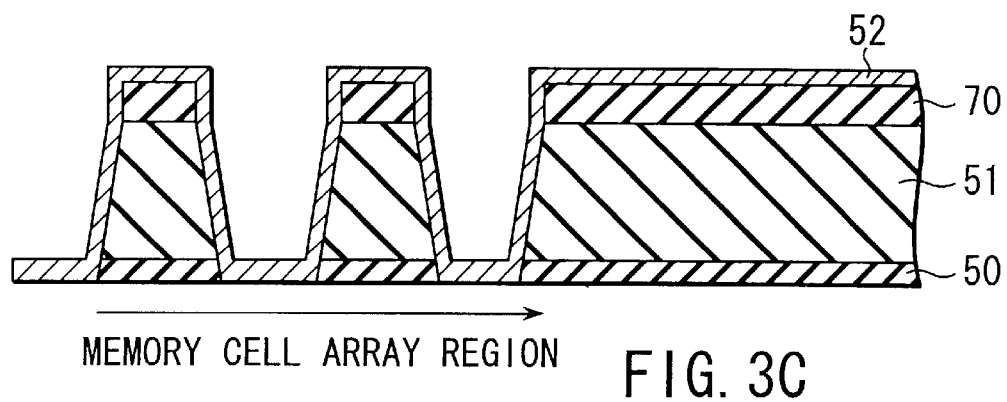

Next, as shown in FIG. 3C, by making use of a CVD method for instance, a Ru film to be made into a storage node electrode 52 is formed on the bottom and sidewall of the groove 71 as well as on the amorphous silicon film 70.

Figure 3D:
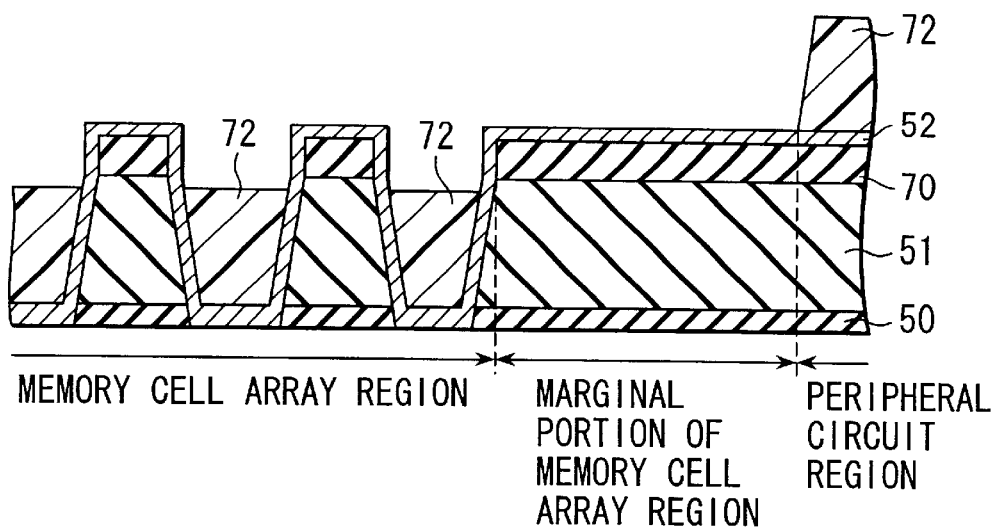

Thereafter, a resist 72 is coated on the storage node electrode 52 and then subjected to a patterning step using lithographic technique. Namely, as shown in FIG. 3D, the patterning of the resist 72 is performed in such a manner that part of the resist 72 is left remained inside the groove 71 formed in the memory cell array region as well as on the surface of the storage node electrode 52 which is located within the peripheral circuit region. It may be preferable on this occasion to employ a dye-containing color resist as the material for this resist 72.

Figure 3E:
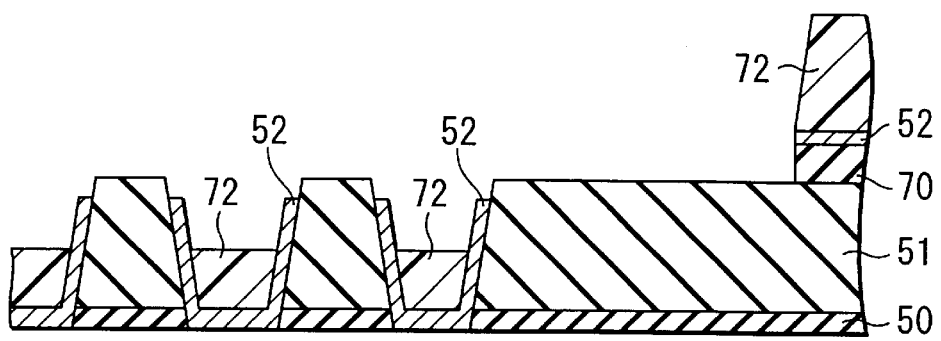

Next, by making use of this patterned resist 72 as a mask, the storage node electrode 52 and the amorphous silicon film 70 are etched off as shown in FIG. 3E by an RIE method. By the way, since the storage node electrode 52 existing inside the groove 71 is protected by the resist 72, the storage node electrode 52 can be prevented from being suffered from the plasma damage to be caused by the RIE method. Whereas, part of the storage node electrode 52 located at an upper inner wall portion of the groove 71 which is not covered with the resist 72 is permitted to be etched. As a result, the upper surface of the storage node electrode 52 disposed within the memory array region is located at a level which is lower than the upper surface of the storage node electrode 52 disposed within the peripheral circuit region. Subsequently, the resist 72 is ashed by ashing treatment.

Figure 3F:
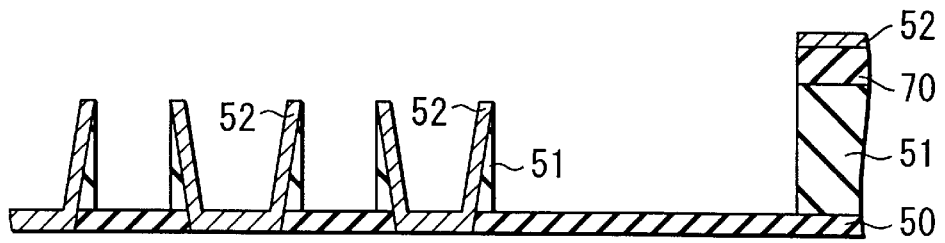
Figure 3G:
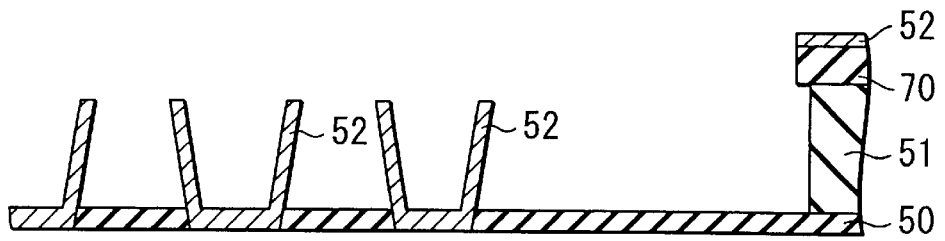

Thereafter, the $SiO_2$ film 51 is etched away by the RIE method for instance as shown in FIG. 3F. However, since the sidewall of the groove 71 is not perfectly perpendicular to the bottom face of the groove 17 but is slightly inclined therefrom, it is difficult to remove all of the $SiO_2$ film 51 which is disposed within the memory cell array region by making use of the RIE.

Accordingly, a wet etching method is employed using an HF solution for example so as to remove all of the residual $SiO_2$ film 51 which is left remained on the sidewall of the storage node electrode 52. On this occasion, the SiN film 50 functions as a stopper for this wet etching. As a result of this step, a cylinder type storage node electrode 52 constituted by upwardly projected Ru film is formed, and at the same time, all of the $SiO_2$ film 51 excluding the one which is located within the peripheral circuit region is completely removed. By the way, the amorphous silicon film 70 and the storage node electrode 52 which are left remained on the $SiO_2$ film 51 of the peripheral circuit region may be also removed in this step.

By the way, according to the prior art, the step of removing the $SiO_2$ film 51 has been performed by making use only of wet etching. However, if the removal of the $SiO_2$ film 51 is performed in such a way, the storage node electrode 52 is more likely to be eroded by the etchant employed in the wet etching, thus deteriorating the properties of the storage node electrode 52. Whereas, according to the aforementioned method as proposed by this invention, since the RIE method and the wet etching method are co-used for the removal of the $SiO_2$ film 51, the time for the wet etching can be substantially shortened. The damage to the storage node electrode 52 that might be caused by the wet etching can be minimized, thus making it possible to prevent the storage node electrode 52 from being deteriorated of its properties.

Figure 3H:
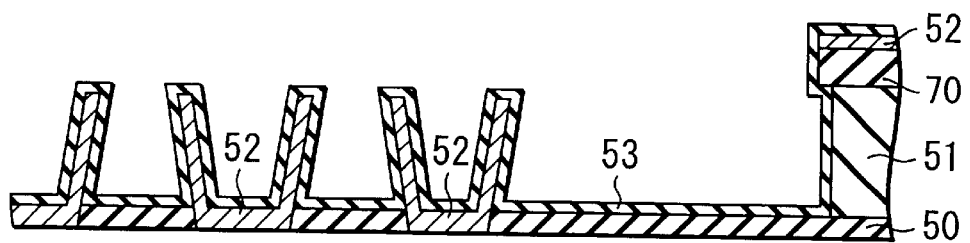

Thereafter, as shown in FIG. 3H, a $Ta_2O_5$ film to be subsequently made into the capacitor insulating film 53 is formed on the surface of SiN 50, on the surface of storage node electrode 52, on the sidewall of $SiO_2$ film 51, and on the sidewall of amorphous silicon film 70 by the CVD method for example.

Figure 3I:
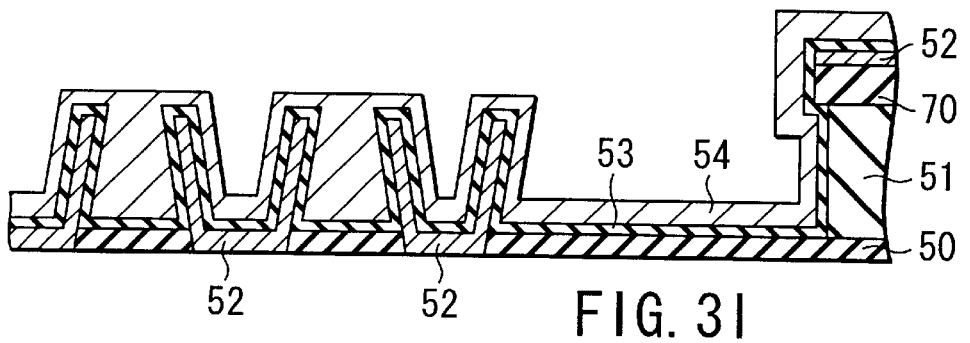

Then, as shown in FIG. 3I, a TiN film to be subsequently made into the plate electrode 54 is formed on the surface of the capacitor insulating film 53. As a matter of course, the upper surface of the plate electrode 54 disposed within the memory array region can be located at a level which is lower than the upper surface of the plate electrode 54 disposed within the peripheral circuit region.

Thereafter, an interlayer insulating film 55 is formed on the surface of the plate electrode 54. This interlayer insulating film 55 may be constituted by a USG (Undoped Silicate Glass) film to be formed by a HDP (High Density Plasma) method, or by a USG film or a BPSG (Boron Phosphorous Silicate Glass) film, both being formed by the CVD using TEOS (tetraethylorthosilicate: $Si(OC_2H_5)_4$) and excellent in step coverage property.

Figure 3J:
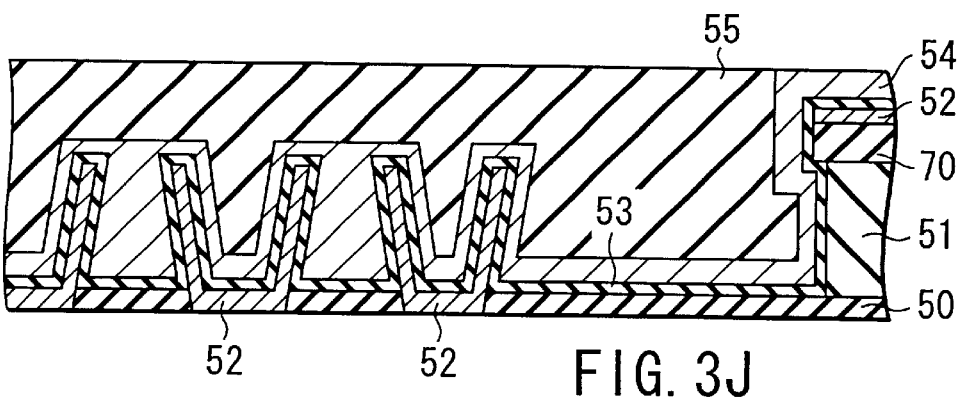

Then, as shown in FIG. 3J, the interlayer insulating film 55 is flattened by a CMP (Chemical Mechanical Polishing) method. By the way, the plate electrode 54 formed within the peripheral circuit region is utilized as a stopper for this CMP. As a result of flattening by this CMP, the interlayer insulating film 55 is permitted to expose within the memory cell array region as well as within the marginal portion of memory cell array region, and at the same time, the plate electrode 52 is permitted to expose within the peripheral circuit region.

Figure 3K:
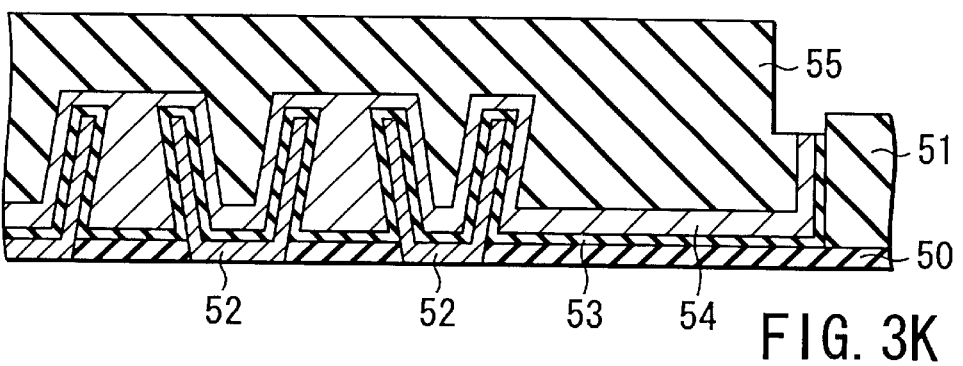
Figure 3L:
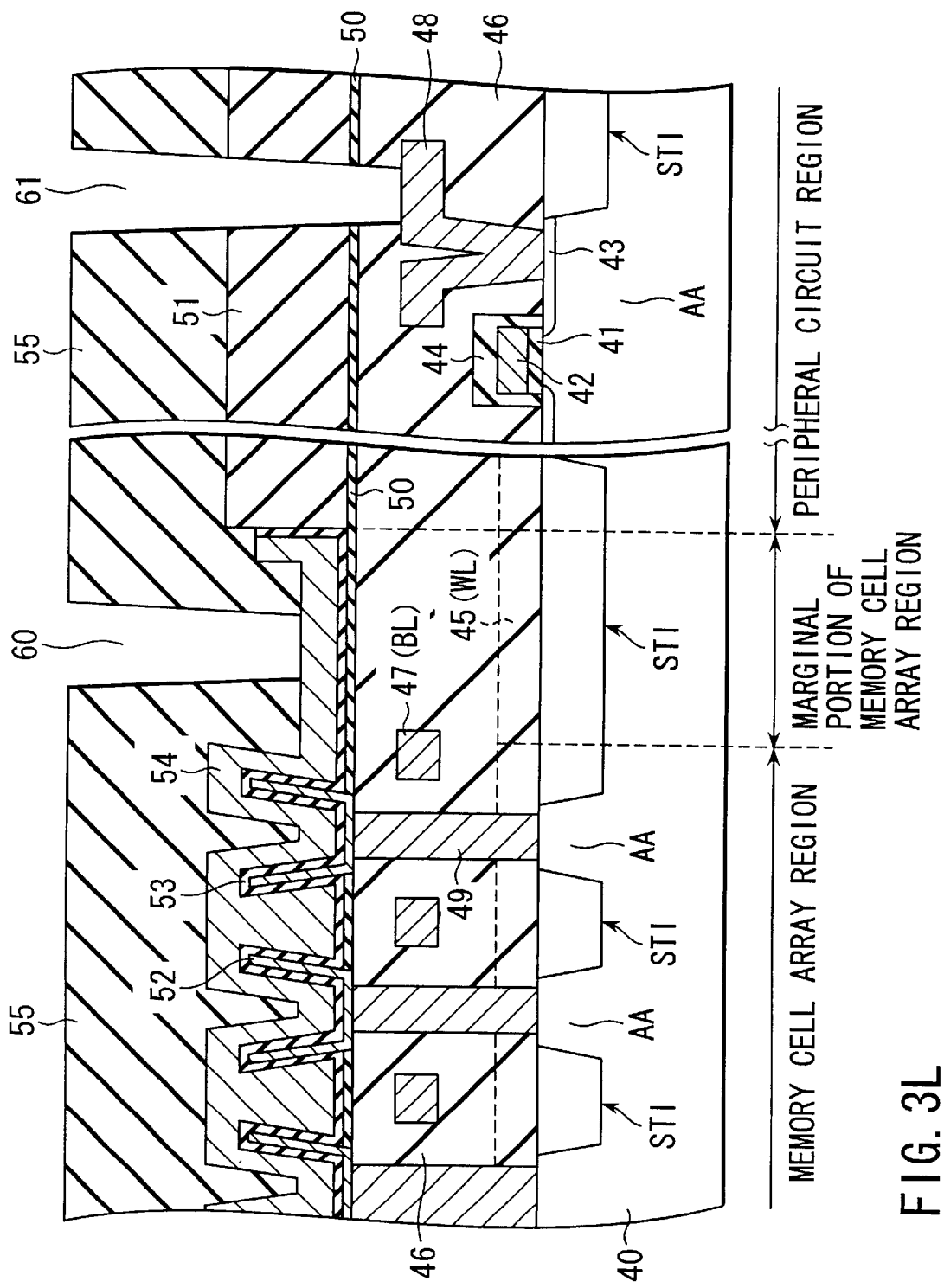

Then, as shown in FIG. 3K, the plate electrode 54, the cell-capacitor insulating film 53, the storage node electrode 52 and the amorphous silicon film 70, all located within the peripheral circuit region, are etched away by the RIE method for instance. On the occasion of this RIE, the interlayer insulating film 55 disposed within the memory cell array region and also within the marginal portion of memory cell array region is utilized as a mask, so that the step of lithography is no longer required.

Subsequently, an additional layer of the interlayer insulating film 55 such as the USG film is deposited again, which is followed by the flattening of the resultant layer by the CMP for instance. Next, as shown in FIG. 3L, a contact hole 60 for making contact with the plate electrode 54 is formed in the marginal portion of memory cell array region by the conventional lithographic technique and RIE method, and concurrently, there is also formed a contact hole 61 for making contact with the metallic wiring layer 48 disposed at the same level with the bit line 47 formed in the peripheral circuit region.

Thereafter, these contact holes 60 and 61 are filled with a polycrystalline silicon film or a metal, and the resultant layer is flattened by the CMP method to thereby form contact plugs 56 and 57, respectively. Finally, metallic wiring layers 58 and 59 are formed on the interlayer insulating film 55 to accomplish the DRAM as shown in FIGS. 2A to 2C.

According to the method of fabricating the DRAM as explained above, it is possible to eliminate the step of lithography which has been required in the conventional method especially in the course of process starting from the formation of the cell-capacitor until finishing of the formation of the contact plug. More specifically, the step of lithography for removing the storage node electrode 52, the cell-capacitor insulating film 53 and the plate electrode 54, all disposed within the peripheral circuit region is no longer required to be performed. Because, according to the manufacturing method of this embodiment, the interlayer insulating film 55 is formed subsequent to the formation of the plate electrode 54, and the CMP is performed utilizing, as a stopper, the plate electrode 54 that has been formed on the SiO₂ film 51 existing within the peripheral circuit region. As a result, while the plate electrode 54 is permitted to expose within the peripheral circuit region where a 3-ply layer consisting of the storage node electrode 52, the cell-capacitor insulating film 53 and the plate electrode 54 is desired to be removed, the interlayer insulating film 55 is permitted to expose within the memory cell array region and also within the marginal portion of memory cell array region, where this 3-ply layer is desired not to be removed. As a result, this interlayer insulating film 55 can be utilized to function substantially as an etching mask, thus making it possible to form an etching mask and to perform an etching without necessitating the patterning process by means of lithographic technique.

This advantage can be attributed not only to the manner of treating the SiO₂ film 51 formed on the interlayer insulating film 55 but also to the position of the plate electrode 54 relative to the regions including the memory cell array region. More specifically, according to the prior art, the SiO₂ film 51 is allowed to remain throughout the entire region including the marginal portion of memory cell array region and the peripheral circuit region, and then, the storage node electrode 52, the cell-capacitor insulating film 53 and the plate electrode 54 are formed on this SiO₂ film 51. As a result, the portion of the plate electrode 54 which is desired to be left remained (the marginal portion of memory cell array region) and the portion of the plate electrode 54 which is desired to be removed (the peripheral circuit region) are caused to be located at the same level with each other, thereby necessitating the step of lithography on the occasion of the aforementioned etching process.

Whereas in the case of this embodiment, only the portion of SiO₂ film 51 which is located within the peripheral circuit region is left remain, and the rest of the SiO₂ film 51 which is located within the other regions is entirely etched away. As a result, the plate electrode 54 in the peripheral circuit region is formed on the SiO₂ film 51, while the plate electrode 54 in the marginal portion of memory cell array region is formed, together with the cell-capacitor insulating film 53, directly on the SiN film 50 formed on the interlayer insulating film 46. Furthermore, the portion of plate electrode 54 which is formed within the peripheral circuit region is disposed higher than the upper surface of the portion of plate electrode 54 which constitutes the cell-capacitor. Therefore, when the stepped portion formed between these portions of plate electrode 54 is buried with the interlayer insulating film 55, and then, the resultant surface is flattened, only the plate electrode 54 existing within the peripheral circuit region is permitted to expose, thus making it possible to form an etching mask by making use of the interlayer insulating film 55.

Figure 4:
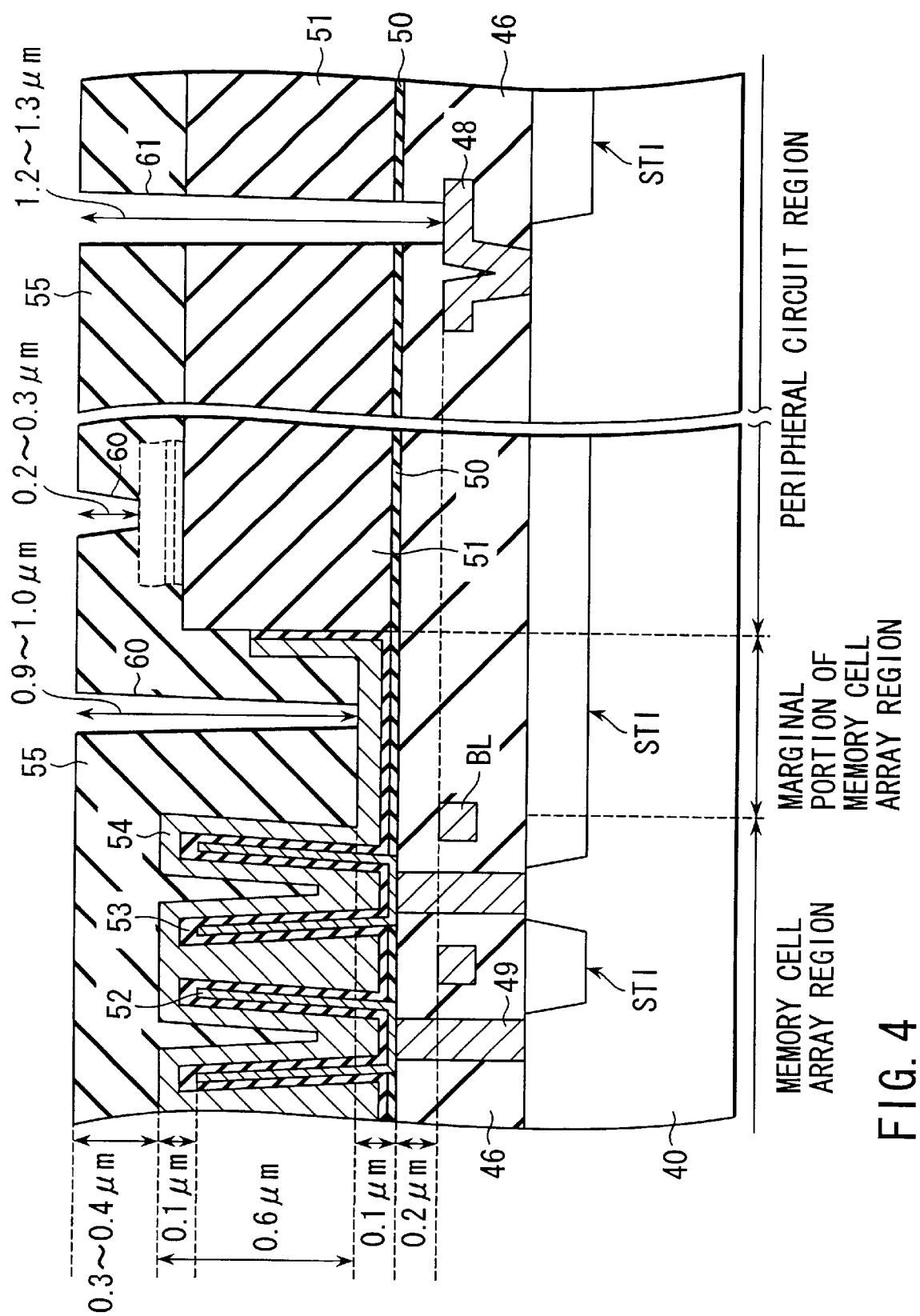
FIG. 4 is a cross-sectional view of the DRAM according to the first embodiment of this invention.

Additionally, since the plate electrode 54 existing within the marginal portion of memory cell array region is located at almost the same level with the bottom surface of the cell-capacitor, a difference in level between the bottom face of the contact hole 60 for making contact with the plate electrode 54 and the bottom face of the contact hole 61 for making contact with the wiring layer 48 of the peripheral circuit region disposed at the same level with the bit line can be minimized as compared with that according to the prior art. This specific feature of the invention will be explained as follows with reference to FIG. 4 illustrating a cross-sectional view of the DRAM. The values shown in this FIG. 4 represent those of one example of DRAM wherein the design rule has been set to 0.15 μm for instance.

As shown in FIG. 4, the film thickness of the interlayer insulating film 46 formed on the bit line BL as well as on the metallic wiring layer 48 is about 0.2 μm. As far as the marginal portion of memory cell array region in which the contact hole 60 is to be formed is concerned, the thickness as measured from the upper surface of the interlayer insulating film 46 up to the upper surface of the plate electrode 54 is about 0.1 μm. The thickness as measured from the upper surface of the plate electrode 54 of the marginal portion of memory cell array region up to the top surface of the plate electrode 54 of the memory cell array region is about 0.6 μm. Further, the interlayer insulating film 55 is 0.3 to 0.4 μm thick as measured from the top of the plate electrode 54 in the memory cell array region. The contact hole 60 therefore is about 0.9 to 1.0 μm deep. On the other hand, the contact hole 61 extending to the wiring layer 48 provided in the peripheral circuit region is about 1.2 to 1.3 μm deep. The contact holes 60 and 61 can be said to have almost the same depth, for the following reason.

According to the prior art, the plate electrode 54 is provided on the capacitor insulating film 53, which in turn is provided on the storage node electrode 52 that is formed on the SiO₂ film 51. Hence, the contact hole 60 extending down to the plate electrode 54 in the marginal portion of memory cell array region has a depth of about 0.2 to 0.3 μm. The depth of this contact hole 60 is only ⅕ to ⅙ of the depth of the contact hole 61 made in peripheral circuit region.

It will be clearly understood from the comparison of these values that the depth of the contact hole 60 to be formed according to this manufacturing method can be regarded as being almost the same as that of the contact hole 61 of the peripheral circuit region. When the depths of these contact holes are made equivalent to each other in this manner, the plasma damage to the plate electrode 54 that may be generated on the occasion of forming these contact holes 60 and 61 can be alleviated, thus making it possible to improve the property and reliability of the cell-capacitor.

If the depth of the contact hole 60 extending down to the plate electrode 54 is set to 0.9 μm, and the depth of the contact hole 61 extending down to the metallic wiring layer 48 is set to 1.2 μm in the example of FIG. 4, a difference in depth between these contact holes would become 0.3 μm. Namely, this difference in depth corresponds to 25% of the depth of the contact hole 61. Even if this difference becomes maximum, the difference in depth between these contact holes would become 0.4 μm, i.e. about 31%. On the other hand, if the contact hole extending down to the plate electrode 54 is to be formed by the conventional method, the depth thereof would be 0.2 μm, and hence the resultant difference to be generated would be about 83% of the depth of the contact hole 61. It is expected that the design rule would be inevitably advanced from 0.13 μm of today to a further smaller value in future, and that together with this increasing refinement, the height of the cylinder of cell-capacitor would become higher. If so, the ratio of the difference in depth between the contact hole extending down to the plate electrode 54 and the contact hole 61 to the depth of the contact hole 61 would become increasingly larger when the conventional method is adopted, thus proportionately enlarging the damage to the plate electrode 54.

By contrast, according to the method proposed by this invention, as the height of the cylinder of cell-capacitor becomes larger, the aforementioned ratio would become smaller, i.e. the damage to the plate electrode 54 can be minimized. Therefore, the merit of the method of this invention would become more conspicuous as the refinement is further advanced in future.

Figure 5A:
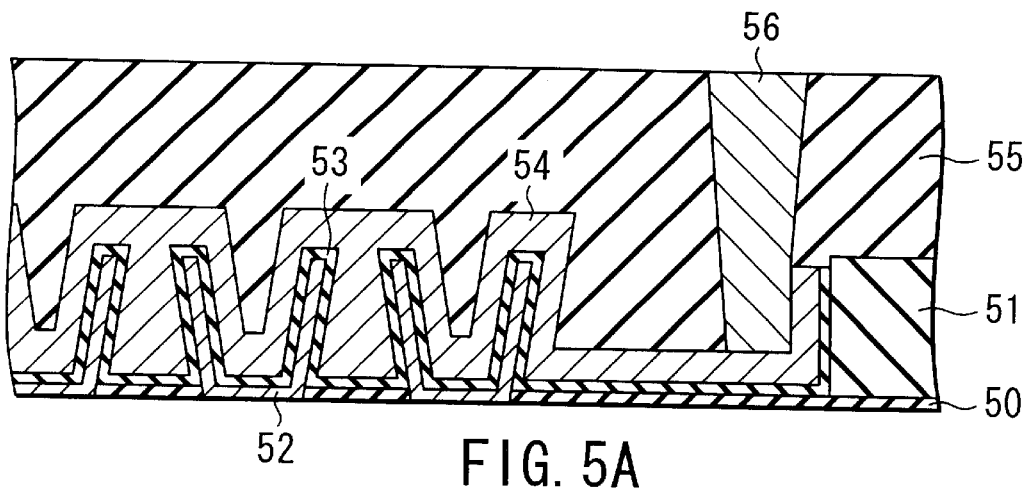
FIGS. 5A to 5C respectively shows a cross-sectional view of the DRAM according to modified examples of the first embodiment of this invention.
Figure 5B:
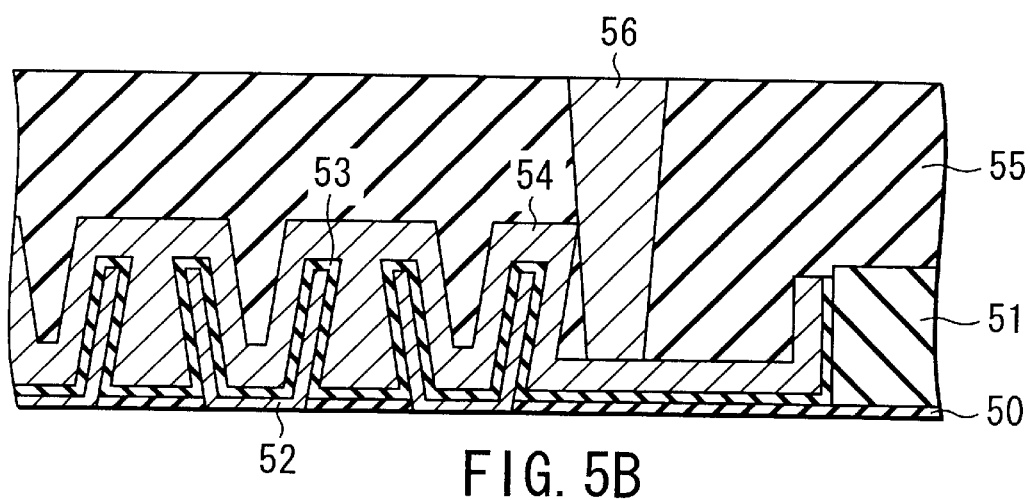
Figure 5C:
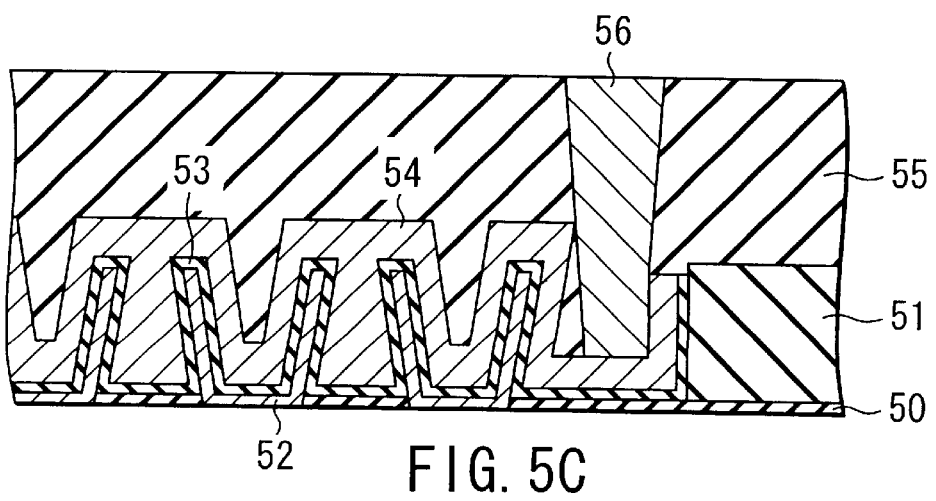

By the way, the contact plug 56 may not necessarily be disposed at the center of the marginal portion of memory cell array region as shown in FIG. 2B. Thus, the contact plug 56 may be disposed as shown in FIGS. 5A to 5C. In the structure shown in FIG. 5A, one of the sidewalls of the contact plug 56 is disposed so as to contact with the plate electrode 54 mounted on a sidewall of the $SiO_2$ film 51.

In the structure shown in FIG. 5B, however, one of the sidewalls of the contact plug 56 is disposed so as to contact with the plate electrode 54 of the cell-capacitor.

Further, in the structure shown in FIG. 5C, the area of the marginal portion of memory cell array region is made smaller, thereby permitting the contact plug 56 to be disposed so as to contact with the plate electrode 54 disposed on a sidewall of the $SiO_2$ film 51 as well as with the plate electrode 54 constituting the cell-capacitor. When the contacting area between the contact plug 56 and the plate electrode 54 is increased in this manner, the contact resistance can be minimized, thus contributing to an improvement of the electric properties of DRAM.

According to the method of fabricating the semiconductor memory device as set forth by this first embodiment, the flatness of the interlayer insulating film covering a cylinder type cell-capacitor can be ensured and at the same time, the number of manufacturing steps can be minimized. Therefore, it is possible to realize an improvement in yield of products and a reduction of manufacturing cost. Moreover, since the depth of the contact hole to be contacted with the plate electrode of capacitor can be made almost the same as that of the contact hole to be contacted with the wiring layer disposed at the same level with the bit line of the peripheral circuit region, it is possible to inhibit the electrode of cell-capacitor from being deteriorated in the manufacturing process of DRAM and to improve the electric properties of the DRAM.

Next, the semiconductor memory device and the method of fabricating the semiconductor memory device according to the second embodiment of this invention will be explained with reference to the DRAM taken up as one example. The structure of this DRAM according to this embodiment is featured in that the cell-capacitor of the DRAM explained in the aforementioned first embodiment is additionally provided with HSG (Hemispherical Grained)-Silicon.

Figure 6:
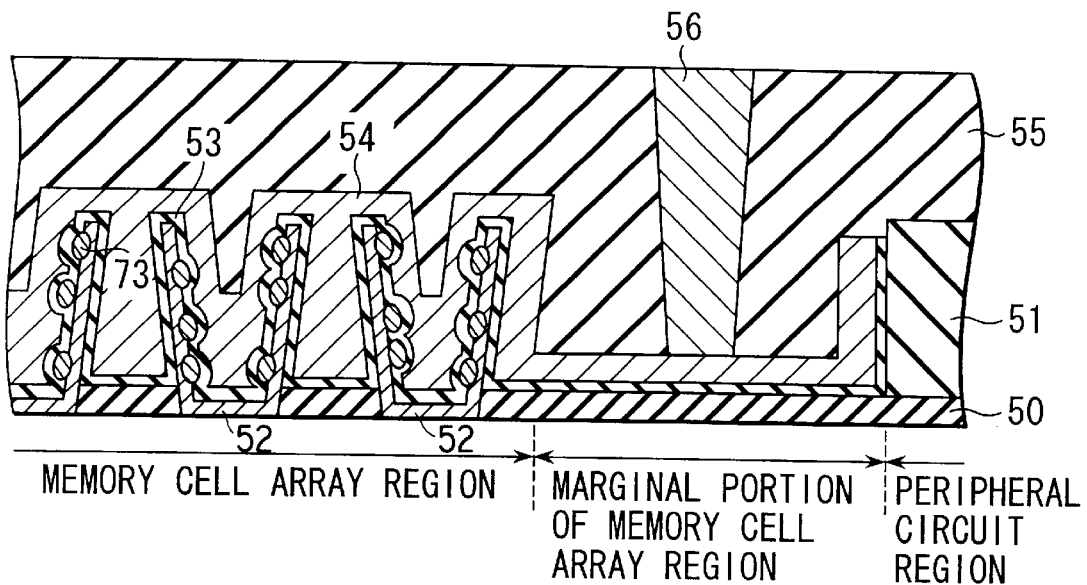
FIG. 6 is a cross-sectional view of the DRAM according to a second embodiment of this invention.

FIG. 6 shows a cross-sectional view of the DRAM according to this embodiment, wherein the construction of the cell-capacitor is illustrated. As shown in FIG. 6, the HSG-Si 73 is attached to the surface of the storage node electrode 52 of the cell-capacitor, and the cell-capacitor insulating film 53 is formed over the HSG-Si 73.

According to this construction, it is possible to obtain the effects explained with reference to the first embodiment and additionally, to effectively increase the capacity of the cell-capacitor since the surface area of capacitor can be increased due to the provision of the HSG-Si 73.

Next, the method of fabricating the DRAM having the aforementioned structure will be explained with reference to FIGS. 7A to 7J. FIGS. 7A to 7J respectively shows a cross-sectional view sequentially illustrating the manufacturing process of the DRAM. By the way, since the structure disposed below the cell-capacitor is the same as that of the aforementioned first embodiment, only the structure of cell-capacitor will be explained below.

First of all, the SiN film 50, the $SiO_2$ film 51 and also an amorphous silicon film 70 as a pattern transfer film are successively deposited on the interlayer insulating film 46 by means of the CVD method. Then, a resist is coated on the surface of the amorphous silicon film 70 to form a resist layer, which is then subjected to an etching process by making use of lithographic technique and the RIE method to thereby form a groove 71 for forming the storage node electrode of the cell-capacitor. Thereafter, a polycrystalline silicon film for forming the storage node electrode 52 is formed on the bottom and sidewall of the groove 71 as well as on the surface of amorphous silicon film 70.

Thereafter, an amorphous silicon film is formed on the polycrystalline silicon film 52 and then subjected to an annealing treatment in vacuum. As a result of this annealing treatment, the amorphous silicon on the polycrystalline silicon film is turned into grains to thereby form the HSG-Si 73, thus obtaining the structure shown in FIG. 7A.

As described above, the HSG-Si is generally formed by annealing an amorphous silicon formed on a polycrystalline silicon film in vacuum. There is a difference in growth temperature between polycrystalline silicon and amorphous silicon, the growth temperature of amorphous silicon being generally lower than the growth temperature of polycrystalline silicon. Therefore, when silicon is permitted to grow at an intermediate temperature between the growth temperature of polycrystalline silicon and the growth temperature of amorphous silicon, the silicon thus obtained is constituted by a mesophase which is intermediate between polycrystal and amorphous phase, the configuration thereof being also graininess. This silicon is known as Rugged Polycrystalline Silicon.

Figure 7A:
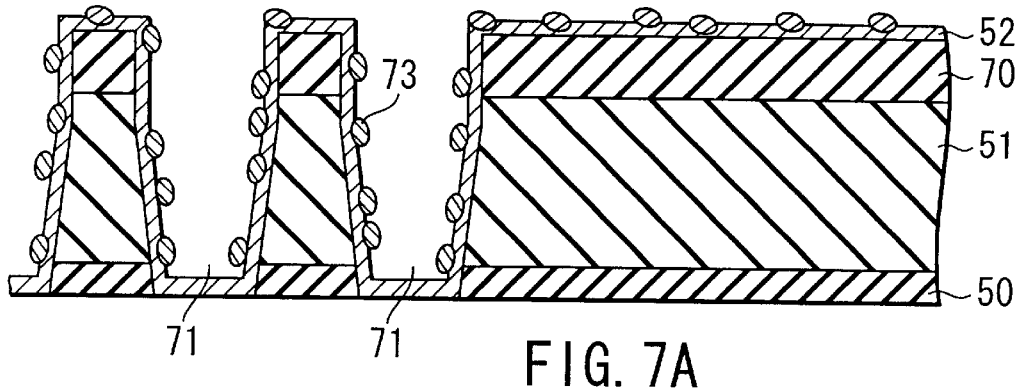
FIGS. 7A to 7J respectively shows a cross-sectional view sequentially illustrating the manufacturing process of the DRAM according to a second embodiment of this invention.
Figure 7B:
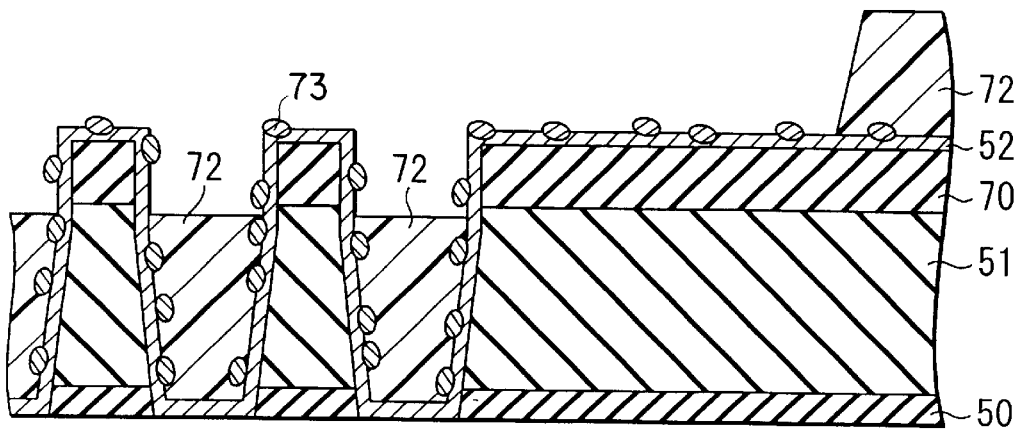

The steps to be followed thereafter are the same as those of the first embodiment. Namely, first of all, a resist 72 is formed on the surface of the storage node electrode 52 and then, made into a pattern as shown in FIG. 7B by means of lithographic technique. Specifically, this patterning is performed in such a way that the resist 72 is left remained in the groove 71 formed within the memory cell array region and in the peripheral circuit region.

Figure 7C:
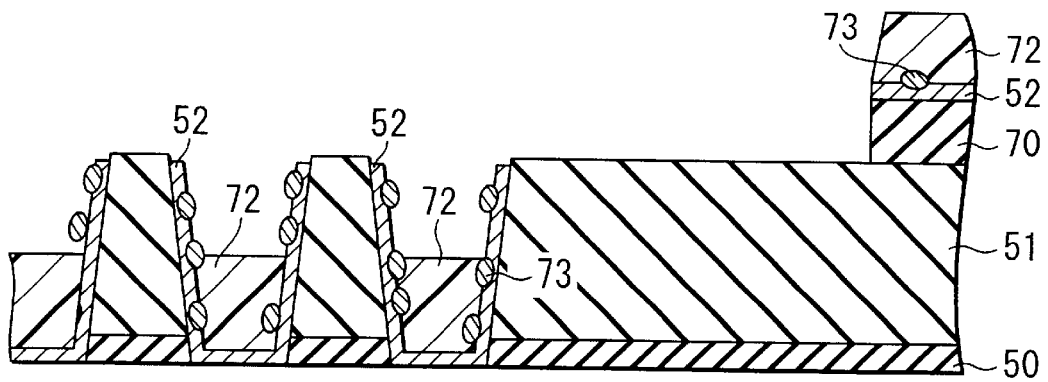

Next, by making use of this patterned resist 72 as a mask, the storage node electrode 52, the HSG-Si 73 and the amorphous silicon film 70 are etched away as shown in FIG. 7C by means of an RIE method.

Figure 7D:
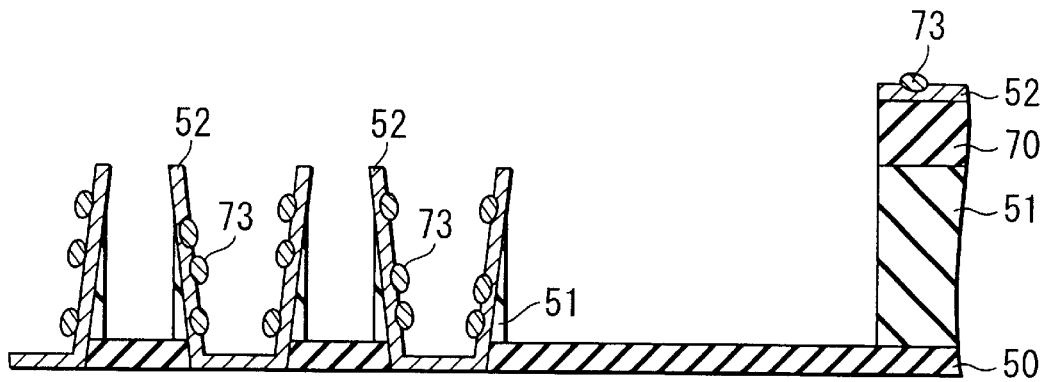

Thereafter, the $SiO_2$ film 51 is etched away by means of the RIE method as shown in FIG. 7D.

Figure 7E:
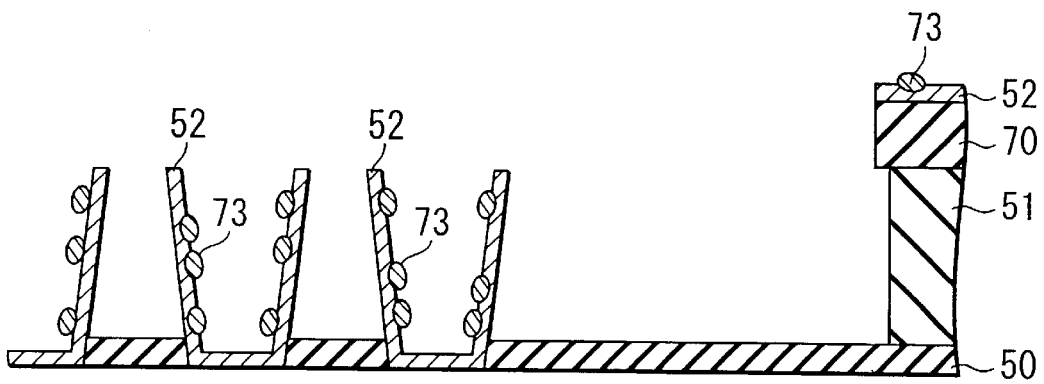

Then, the $SiO_2$ film 51 which is left remained on the sidewall of the storage node electrode 52 is entirely etched away by means of wet etching method to obtain the structure shown in FIG. 7E. On this occasion, the SiN film 50 functions as a stopper for this wet etching. By the way, the amorphous silicon film 70, the storage node electrode 52 and the HSG-Si 73, which are left remained on the $SiO_2$ film 51 of the peripheral circuit region may be also removed in this step. As a result of these steps, the polycrystalline silicon film having the HSG-Si 73 adhered thereon is formed into an upwardly projected cylindrical storage node electrode 52.

Figure 7F:
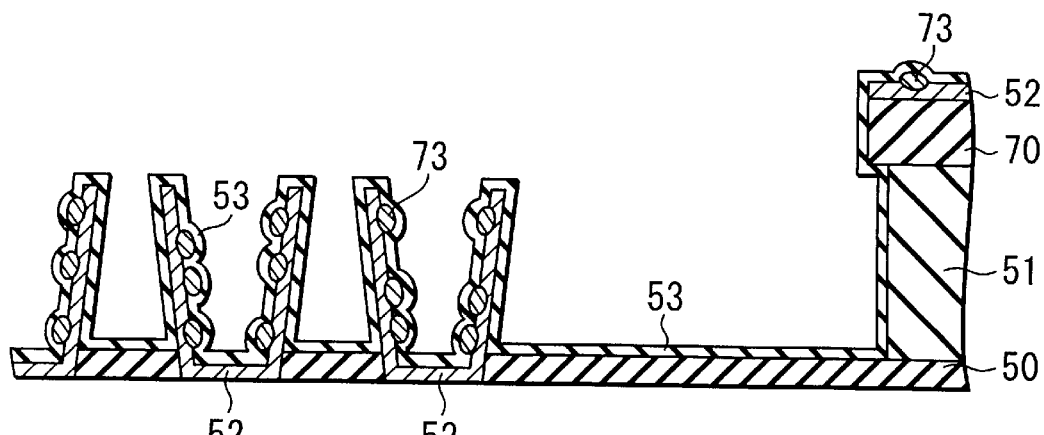

Thereafter, as shown in FIG. 7F, a $Ta_2O_5$ film to be subsequently made into the capacitor insulating film 53 is formed on the surface of SiN 50, on the surface of storage node electrode 52, on the sidewall of $SiO_2$ film 51, and on the sidewall of amorphous silicon film 70 by means of the CVD method for example.

Figure 7G:
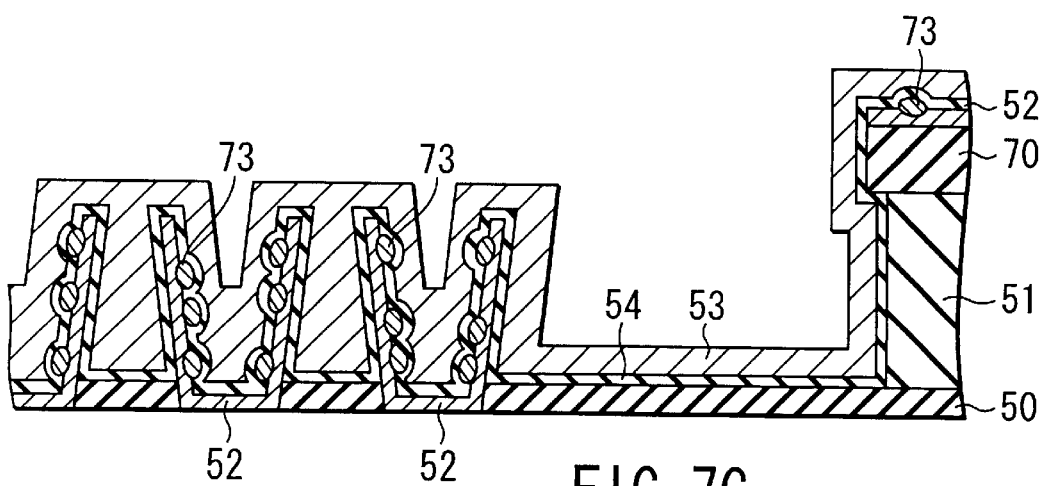

Then, as shown in FIG. 7G, a TiN film to be subsequently made into the plate electrode 54 is formed on the surface of the capacitor insulating film 53. As a matter of course, the upper surface of the plate electrode 54 disposed within the peripheral circuit region is located at a level which is higher than the upper surface of the plate electrode 54 disposed within the memory cell array region.

Thereafter, an interlayer insulating film 55 is formed on the surface of the plate electrode 54. This interlayer insulating film 55 may be constituted by a USG film to be formed by means of a HDP method, or by a USG film or a BPSG film, both being formed by means of the CVD using TEOS.

Figure 7H:
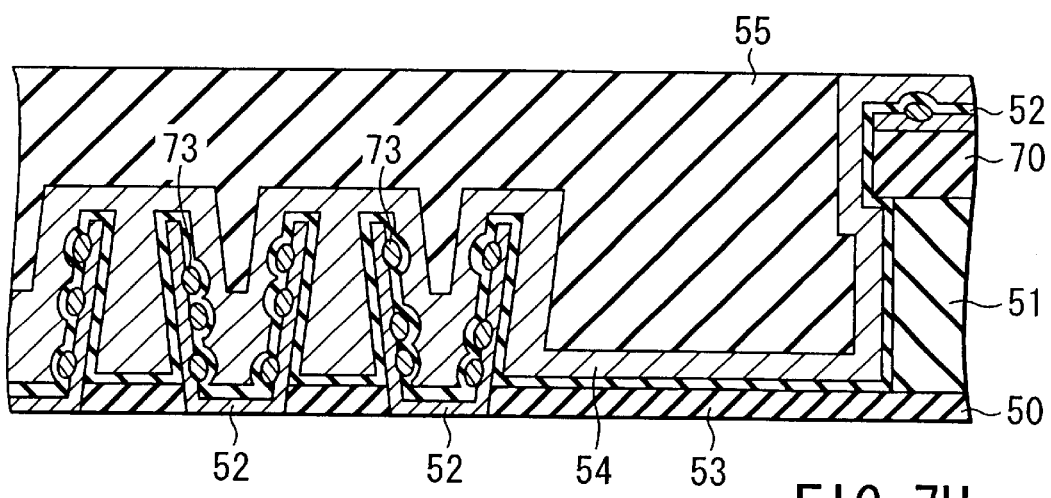

Then, as shown in FIG. 7H, the interlayer insulating film 55 is flattened by means of a CMP. By the way, the plate electrode 54 formed within the peripheral circuit region is utilized as a stopper for this CMP. As a result of this CMP, the plate electrode 54 is permitted to expose within the peripheral circuit region, and at the same time, the interlayer insulating film 55 which is formed on the plate electrode 54 is permitted to expose within the memory cell array region.

Figure 7I:
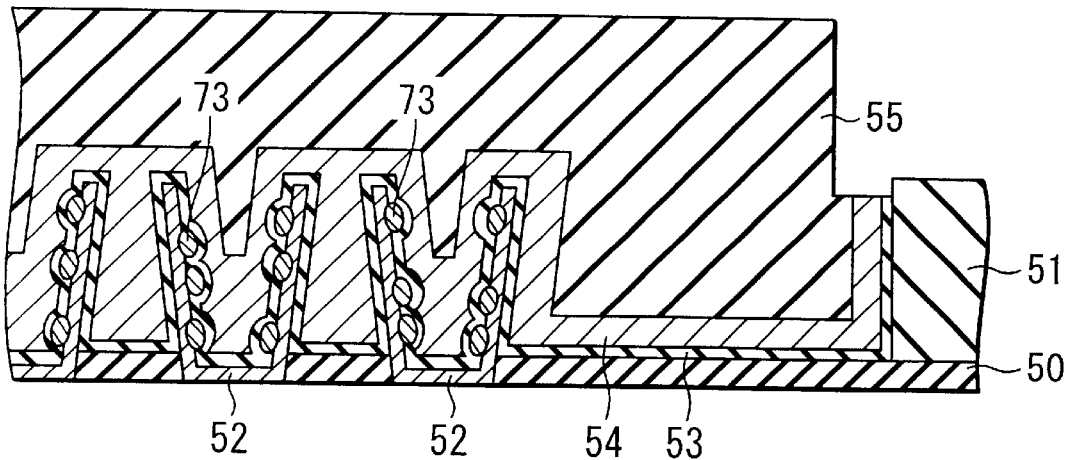

Then, as shown in FIG. 7I, the plate electrode 54, the cell-capacitor insulating film 53, the HSG-Si 73, the storage node electrode 52 and the amorphous silicon film 70, all located within the peripheral circuit region, are etched away by means of the RIE method. On the occasion of this RIE, since the interlayer insulating film 55 is utilized as a mask, the step of lithography is no longer required.

Figure 7J:
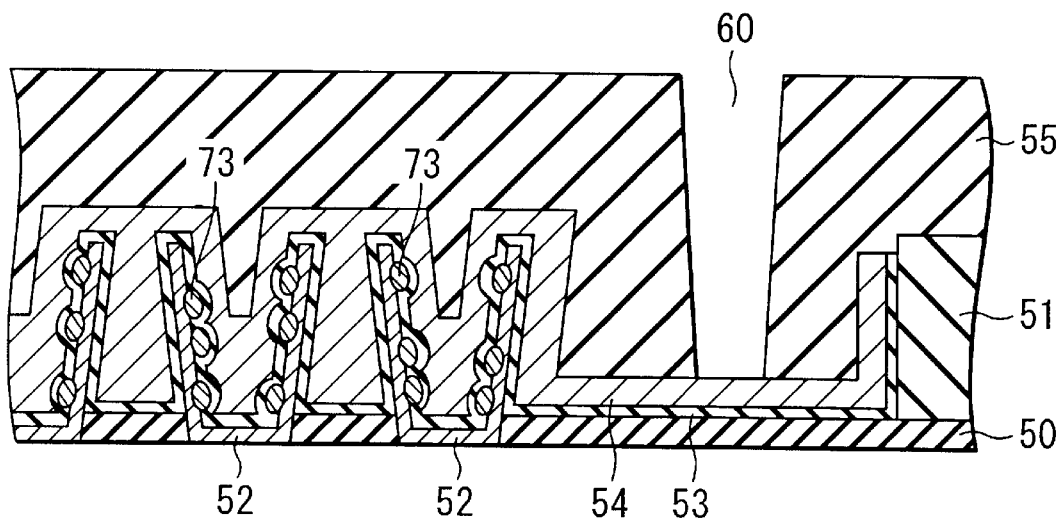

Subsequently, an additional layer of the interlayer insulating film 55 such as the USG film is deposited again, which is followed by the flattening of the resultant layer by means of the CMP for instance. Next, as shown in FIG. 7J, a contact hole 60 for making contact with the plate electrode 54 is formed in the marginal portion of memory cell array region by means of the conventional lithographic technique and RIE method. Concurrently, although it is not shown, there is also formed a contact hole for making contact with the metallic wiring layer disposed at the same level with the bit line which is formed in the peripheral circuit region.

Thereafter, the contact hole 60 and the contact hole formed in the peripheral circuit region are filled with a metal for instance, and the resultant layer is flattened by means of the CMP method to thereby form contact plugs 56, thus obtaining the structure as shown in FIG. 6.

According to the manufacturing method described above, it is possible, as in the case of the first embodiment, to reduce the step of lithography which has been required in the conventional method especially in the course of process starting from the formation of the cell-capacitor until finishing of the formation of the contact plug. Therefore, the process of manufacturing the DRAM can be simplified and the manufacturing cost can be reduced.

Further, since the plate electrode 54 disposed within the marginal portion of memory cell array region is located at the same level with the bottom face of the cell-capacitor, it is possible to minimize the difference between the bottom face of the contact hole 60 for making contact with the plate electrode 54 and the bottom face of the contact hole for making contact with the wiring layer disposed at the level of the bit line of the peripheral circuit region. Therefore, the damage to the plate electrode 54 due to the RIE can be alleviated, thus making it possible to form a cell-capacitor of high performance and high reliability.

Further, since the HSG-Si 73 is formed on the surface of the storage node electrode 52, the surface area of capacitor can be increased and hence, the capacity of cell-capacitor can be increased.

Figure 8A:
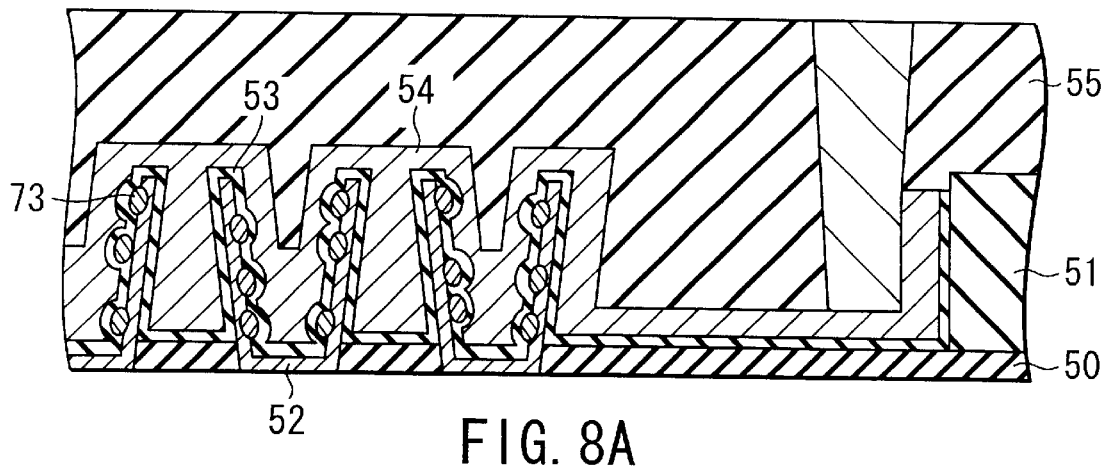
FIGS. 8A to 8C respectively shows a cross-sectional view of the DRAM according to modified examples of the second embodiment of this invention.
Figure 8B:
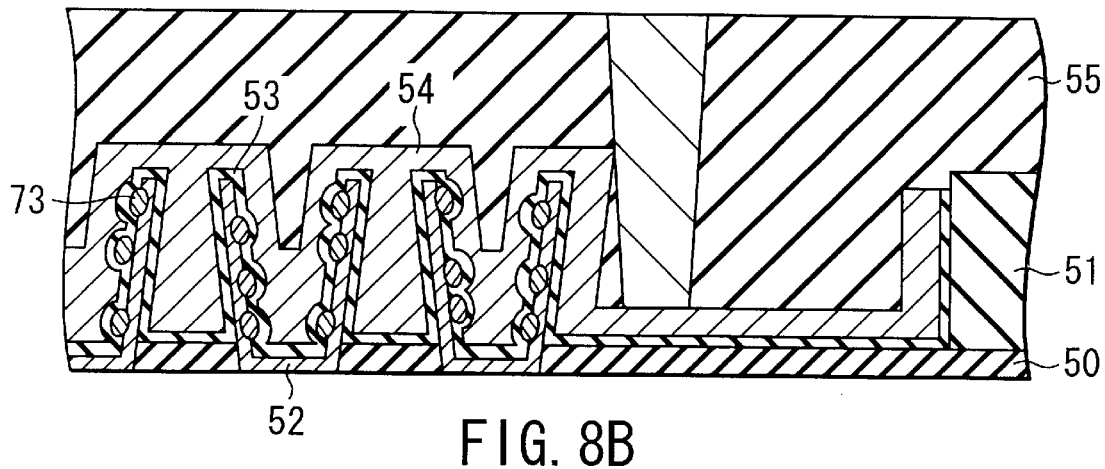
Figure 8C:
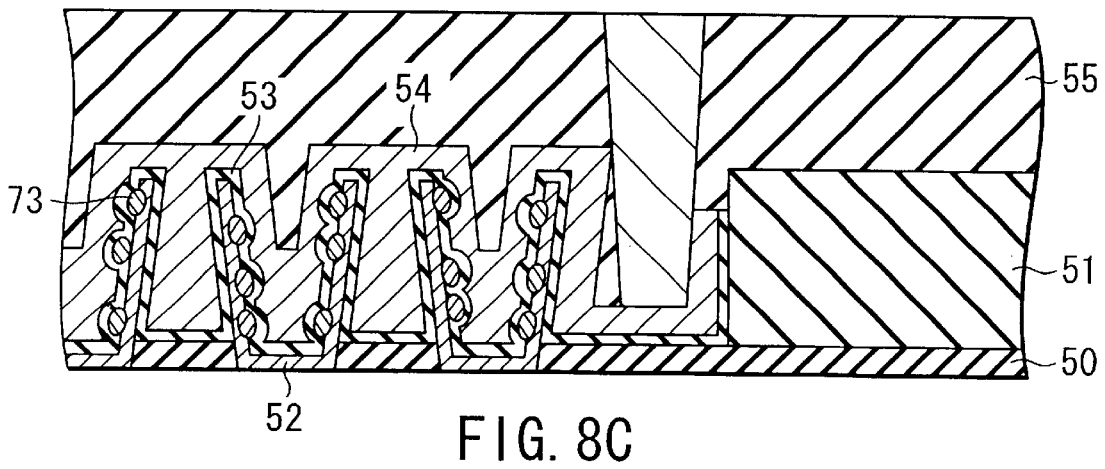

Alternatively, as shown in FIGS. 8A to 8C, one of the sidewalls of the contact plug 56 may be disposed so as to contact with the plate electrode 54 mounted on a sidewall of the SiO$_2$ film 51 of the peripheral circuit region and/or with the plate electrode 54 constituting the cell-capacitor.

According to the semiconductor memory device of this invention, it is no longer necessary to produce dummy capacitor in the memory cell array region and therefore, it is possible to improve the areal efficiency of the device.

Furthermore, it is possible according to the method of fabricating the semiconductor memory device of this invention to minimize the plasma damage to the plate electrode of cell-capacitor due to the application of RIE. Therefore, it is possible to prevent the cell-capacitor from being deteriorated and hence to improve the performance and reliability of DRAM. Additionally, the manufacturing process of DRAM can be simplified without sacrificing the step-covering property of the cell-capacitor of cylinder type. Therefore, it is possible to reduce the manufacturing cost while permitting the yield to be improved in the manufacture of DRAM.

By the way, although the DRAM is exemplified in the aforementioned first and second embodiments, this invention can be of course applied to all kinds of element having the similar structure as that of the DRAM. Further, the contact plugs 56 and 57 may be part of the metallic wiring layers 58 and 59.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device which comprises;
    a semiconductor body provided with a memory cell array region wherein a cell transistor of memory cell is formed, with a peripheral circuit region wherein peripheral circuits other than said memory cell are formed, and with a marginal portion of memory cell array region which constitutes a boundary between said memory cell array region and said peripheral circuit region;
    an insulating film formed on said semiconductor body and having an opening in said memory cell array region and said marginal portion of memory cell array region;
    a cell-capacitor lower electrode of cylinder type which is formed on said semiconductor body in said memory cell array region and is electrically connected with an impurity diffusion layer of said cell transistor;
    a cell-capacitor insulating film covering said cell-capacitor lower electrode;
    a cell-capacitor upper electrode on said cell-capacitor insulating film and said semiconductor body within said memory cell array region and said marginal portion of memory cell array region;
    an interlayer insulating film formed on said cell-capacitor upper electrode and said insulating film; and
    a first contact plug formed in said interlayer insulating film and connected with said cell-capacitor upper electrode within said marginal portion of memory cell array region;
    wherein said cell-capacitor upper electrode formed extending from said memory cell array region to said marginal portion of memory cell array region stands also along a sidewall of said opening formed in said insulating film.

2. The semiconductor memory device according to claim 1, wherein the upper surface of said insulating film located in said peripheral circuit region is higher than the upper surface of said cell-capacitor lower electrode located in said memory cell array region.

3. The semiconductor memory device according to claim 1, which further comprises a second contact plug reaching a first metallic wiring layer formed in said semiconductor body within said peripheral circuit region, wherein a difference in depth between said first and second contact plugs is not more than 35% of the depth of said second contact plug.

4. The semiconductor memory device according to claim 1, wherein said first contact plug is contacted, through the bottom face and sidewall thereof, with said cell-capacitor upper electrode.

5. The semiconductor memory device according to claim 1, wherein said first contact plug constitutes part of a second metallic wiring layer formed in said interlayer insulating film.

6. A method of fabricating a semiconductor memory device which comprises the steps of;
   forming a cell transistor of memory cell and a peripheral transistor on semiconductor substrate within a memory cell array region and a peripheral circuit region, respectively;
   forming an interlayer insulating film on said semiconductor substrate within said memory cell array region, said peripheral circuit region and said marginal portion of memory cell array region which constitutes a boundary between said memory cell array region and said peripheral circuit region to thereby cover said cell transistor and said peripheral transistor;
   forming a contact plug connected with said cell transistor in said interlayer insulating film;
   forming an insulating film on said interlayer insulating film;
   forming a groove in said insulating film within said memory cell array region, said groove being formed to a depth reaching down to an upper surface of said interlayer insulating film to thereby permit the top surface of said contact plug to be exposed at a bottom of said groove;
   forming a cell-capacitor lower electrode on the bottom face and sidewall of said groove as well as on said insulating film within a region extending from said memory cell array region to said peripheral circuit region to thereby permit said cell-capacitor lower electrode to be contacted with said contact plug at the bottom of said groove;
   forming an etching mask on said cell-capacitor lower electrode within said peripheral circuit region and in said groove; and
   forming a cell-capacitor lower electrode of cylinder type by etching part of said insulating film existing in said memory cell array region and said marginal portion of memory cell array region.

7. The method according to claim 6, which further comprises the steps of;
   removing said etching mask subsequent to the step of forming said cell-capacitor lower electrode of cylinder type;
   forming a cell-capacitor insulating film to thereby cover at least said cell-capacitor lower electrode; and
   forming a cell-capacitor upper electrode on said cell-capacitor insulating film and over a region extending from said memory cell array region to said peripheral circuit region.

8. The method according to claim 6, wherein said cell-capacitor lower electrode remaining on said insulating film located in said peripheral circuit region is disposed higher than the upper surface of said cell-capacitor lower electrode of cylinder type which is located in said memory cell array region.

9. A method of fabricating a semiconductor memory device which comprises the steps of;
   forming an insulating film on a semiconductor body provided with a memory cell array region wherein a cell transistor of memory cell is formed, with a peripheral circuit region wherein peripheral circuits other than said memory cell are formed, and with a marginal portion of memory cell array region which constitutes a boundary between said memory cell array region and said peripheral circuit region;
   removing parts of said insulating film which are at said memory cell array region and at the marginal portion of the memory cell array region, thereby making opening;
   forming a plurality of cell-capacitor lower electrodes of cylinder type in the opening;
   forming a cell-capacitor insulating film covering at least said cell-capacitor lower electrodes;
   forming cell-capacitor upper electrode on said cell-capacitor insulating film and over a region extending from said memory cell array region to said peripheral circuit region;
   forming an interlayer insulating film on said cell-capacitor upper electrodes; and
   flattening said interlayer insulating film by making use of, as a stopper, said cell-capacitor upper electrode which are located in said peripheral circuit region.

10. A method of fabricating a semiconductor memory device which comprises the steps of;
    forming an insulating film on a semiconductor body provided with a memory cell array region wherein a cell transistor of memory cell is formed, with a peripheral circuit region wherein peripheral circuits other than said memory cell are formed, and with a marginal portion of memory cell array region which constitutes a boundary between said memory cell array region and said peripheral circuit region;
    removing parts of said insulating film which are at said memory cell array region and at the marginal portion of the memory cell array region, thereby making opening;
    forming a plurality of cell-capacitor lower electrodes of cylinder type in the opening;
    forming a cell-capacitor insulating film covering at least said cell-capacitor lower electrodes;
    forming cell-capacitor upper electrode on cell-capacitor insulating film and over a region extending from said memory cell array region to said peripheral circuit region;
    forming a first interlayer insulating film on said cell-capacitor upper electrodes;
    flattening said first interlayer insulating film by making use of, as a stopper, said cell-capacitor upper electrode which are located in said peripheral circuit region to thereby permit said cell-capacitor upper electrodes existing in said peripheral circuit region to be exposed; and
    etching away at least said cell-capacitor upper electrodes existing in said peripheral circuit region by making use of, as a mask, said first interlayer insulating film located in said memory cell array region and in said marginal portion of memory cell array region.

11. The method according to claim 10, which further comprises the step of;

removing, through etching, said cell-capacitor insulating film and said cell-capacitor lower electrode existing in said peripheral circuit region by making use of, as a mask, said first interlayer insulating film located in said memory cell array region and in said marginal portion of memory cell array region after the etching step of said cell-capacitor upper electrode.

12. The method according to claim 10, which further comprises the steps of;

forming a second interlayer insulating film over a region extending from said memory cell array region to said peripheral circuit region subsequent to the step of removing said cell-capacitor upper electrode; and forming a first contact plug to be connected with said cell-capacitor upper electrode located in said marginal portion of memory cell array region together with the formation of a second contact plug to be connected with a metallic wiring layer formed in said semiconductor body within said peripheral circuit region.

13. The method according to claim 11, which further comprises the steps of;

forming a second interlayer insulating film over a region extending from said memory cell array region to said peripheral circuit region subsequent to the step of removing said cell-capacitor upper electrode; and forming a first contact plug to be connected with said cell-capacitor upper electrode located in said marginal portion of memory cell array region together with the formation of a second contact plug to be connected with a metallic wiring layer formed in said semiconductor body within said peripheral circuit region.

14. The method according to claim 9, wherein said cell-capacitor upper electrode remaining on said insulating film in said peripheral circuit region is disposed higher than the upper surface of said cell-capacitor upper electrode of cylinder type which is formed within said memory cell array region.

15. The method according to claim 10, wherein said cell-capacitor upper electrode remaining on said insulating film in said peripheral circuit region is disposed higher than the upper surface of said cell-capacitor upper electrode of cylinder type which is formed within said memory cell array region.

16. The method according to claim 11, wherein said cell-capacitor upper electrode remaining in said insulating film in said peripheral circuit region is disposed higher than the upper surface of said cell-capacitor upper electrode of cylinder type which is formed within said memory cell array region.

* * * * *